United States Patent
Sato et al.

(10) Patent No.: US 8,299,600 B2
(45) Date of Patent: Oct. 30, 2012

(54) SEMICONDUCTOR DEVICE AND MANUFACTURING METHOD THEREOF

(75) Inventors: Yukihiro Sato, Tokyo (JP); Katsuhiko Funatsu, Tokyo (JP); Hiroyuki Nakamura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 401 days.

(21) Appl. No.: 12/619,561

(22) Filed: Nov. 16, 2009

(65) Prior Publication Data

US 2010/0123240 A1    May 20, 2010

(30) Foreign Application Priority Data

Nov. 18, 2008 (JP) ................................ 2008-294816

(51) Int. Cl.
*H01L 23/48* (2006.01)
(52) U.S. Cl. .................. 257/692; 257/E23.01
(58) Field of Classification Search .............. 257/692, 257/E23.01
See application file for complete search history.

(56) References Cited

U.S. PATENT DOCUMENTS

2007/0228534 A1*  10/2007  Uno et al. ................... 257/678

FOREIGN PATENT DOCUMENTS

| JP | 2005-243685 A | 9/2005 |
| JP | 2007-266218 A | 10/2007 |

* cited by examiner

*Primary Examiner* — Matthew W Such
*Assistant Examiner* — Krista Soderholm
(74) *Attorney, Agent, or Firm* — Miles & Stockbridge P.C.

(57) ABSTRACT

A semiconductor device is provided with improved reliability. A semiconductor chip is mounted over a chip mounting portion of a lead frame via solder. A metal plate is arranged over a source pad of the semiconductor chip and a lead portion of a lead frame via solder. A solder reflow process is performed thereby to bond the semiconductor chip over the chip mounting portion with a solder, and to bond the metal plate to the source pad and the lead portion with the other solders. The lead frame is formed of a copper alloy, and thus has its softening temperature higher than the temperature of the solder reflow process. The metal plate is formed of oxygen-free copper, and has its softening temperature lower than the temperature of the solder reflow process, whereby the metal plate is softened in the solder reflow process. Thereafter, a gate pad electrode of the semiconductor chip is coupled to a lead portion via the wire, a sealing resin portion is formed, and then the lead frame is cut.

23 Claims, 20 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2008-294816 filed on Nov. 18, 2008 including the specification, drawings and abstract is incorporated herein by reference in its entirety.

BACKGROUND OF THE INVENTION

The present invention relates to semiconductor devices, and more particularly, a technique effectively applied to a semiconductor device for establishing electrical coupling between an electrode exposed to an upper surface of a semiconductor chip and a lead terminal by use of a metal plate.

Bonding systems in discrete products, such as a power metal-oxide semiconductor field-effect transistor (MOSFET) or insulated gate bipolar transistor (IGBT), have been recently proposed which are designed to couple an electrode pad on the upper surface of a semiconductor chip to the lead terminal by a metal plate comprised of copper, aluminum, or the like, instead of bonding wires, for the purpose of reduction in on-resistance or inductance.

For example, Japanese Unexamined Patent Publication No. 2005-243685 (Patent Document 1), and Japanese Unexamined Patent Publication No. 2007-266218 (Patent Document 2) disclose a semiconductor package including a metal plate containing copper and coupled to a source electrode pad of the semiconductor chip.

[Patent Document 1]
Japanese Unexamined Patent Publication No. 2005-243685
[Patent Document 2]
Japanese Unexamined Patent Publication No. 2007-266218

SUMMARY OF THE INVENTION

Studies by the inventors have shown the following.

A bonding system for coupling an electrode pad on an upper surface of a semiconductor chip to a lead terminal by a metal plate instead of a bonding wire can reduce a conduction loss, thereby improving electrical characteristics of a semiconductor device, as compared to the case of use of the bonding wire. Bonding of the metal plate to the electrode pad of the semiconductor chip and the lead portion is performed preferably by use of solder so as to improve the electrical conductivity, bonding strength, and the like.

The inventors, however, have found out through studies that after solder-bonding the metal plate to the electrode pad of the semiconductor chip and the lead terminal, mechanical and thermal stress can be generated in the metal plate to cause peeling of a solder bonded portion between the metal plate and the electrode pad and lead terminal of the semiconductor chip. Even when the peeled part of the solder bonded portion of the metal plate is small at the timing of appearance, a peeled area may be enlarged from the peeled part as a starting point in conducting a loading test, such as a high-temperature and high-humidity loading test, on a semiconductor device finished. Thus, in order to further improve the reliability of the semiconductor device, the peeling of the solder bonded portion of the metal plate is desired to be prevented as much as possible.

Accordingly, it is an object of the present invention to provide a technique that can improve the reliability of a semiconductor device.

The above, other objects, and novel features of the invention will become apparent from the description of the present specification with reference to the accompanying drawings.

The outline of representative aspects of the invention disclosed in the present application will be briefly described below.

A semiconductor device according to a representative embodiment of the invention includes a chip mounting portion, a semiconductor chip mounted over the chip mounting portion, a first lead portion arranged spaced apart from the chip mounting portion, a metal plate for electrically coupling the first lead portion to a first electrode of the semiconductor chip, and a sealing member covering these elements. A hardness of the metal plate is lower than that of each of the chip mounting portion and the first lead portion.

A manufacturing method of a semiconductor device according to a representative embodiment of the invention includes the steps of: (a) preparing a lead frame including a chip mounting portion and a first lead portion; (b) mounting a semiconductor chip over the chip mounting portion of the lead frame via a bonding material; and (c) arranging a metal plate over a first electrode of the semiconductor chip via a first solder, and over the first lead portion via a second solder. The method further includes the steps of: (d) bonding the metal plate to the first electrode of the semiconductor chip via the first solder and to the first lead portion via the second solder by a heat treatment for melting the first solder and the second solder; and (e) forming a sealing member for covering a part of the chip mounting portion, a part of the first lead portion, the semiconductor chip, and the metal plate. A softening temperature of the metal plate used in the step (c) is lower than a softening temperature of the lead frame prepared in the step (a).

A manufacturing method of a semiconductor device according to another representative embodiment of the invention includes the steps of: (a) preparing a lead frame including a chip mounting portion and a first lead portion; (b) mounting a semiconductor chip over the chip mounting portion of the lead frame via a bonding material; and (c) arranging a metal plate over a first electrode of the semiconductor chip via a first solder, and over the first lead portion via a second solder. The manufacturing method further includes the steps of: (d) bonding the metal plate to the first electrode of the semiconductor chip via the first solder and to the first lead portion via the second solder by a heat treatment for melting the first solder and the second solder; and (e) forming a sealing member for covering a part of the chip mounting portion, a part of the first lead portion, the semiconductor chip, and the metal plate. A rate of decrease in hardness of the metal plate by the heat treatment in the step (d) is larger than a rate of decrease in hardness of the lead frame by the heat treatment in the step (d).

The effects provided by the representative embodiments of the invention disclosed in the present application will be briefly described below.

According to the representative embodiments, the reliability of the semiconductor device can be improved.

DETAILED DESCRIPTION OF THE PREFERRED EMBODIMENTS

Figure 1:
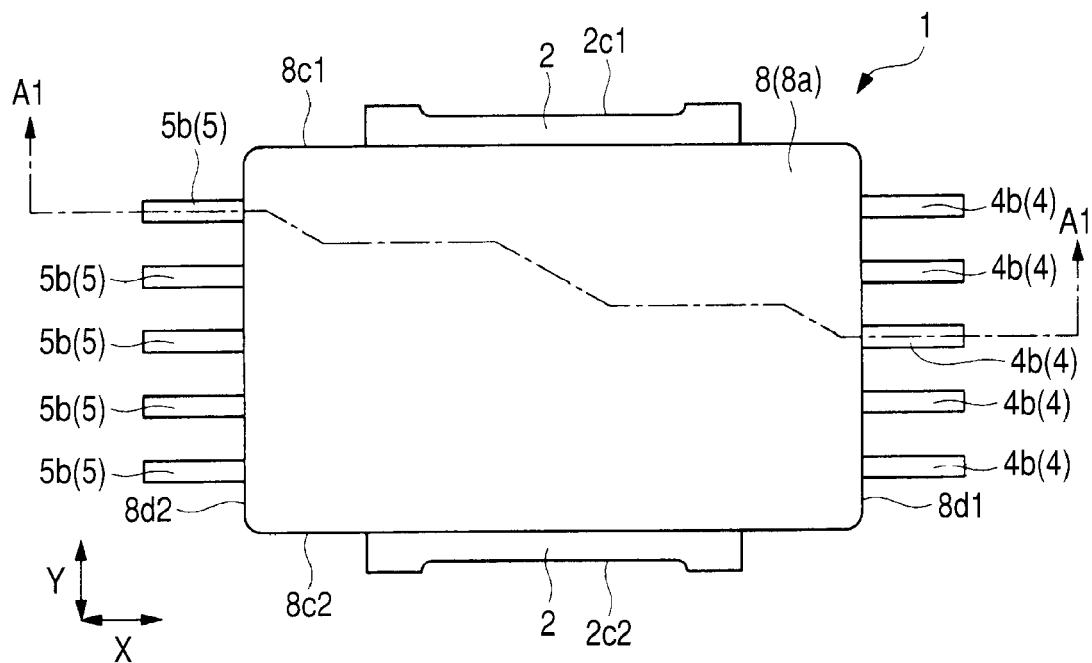
FIG. 1 is a top view of a semiconductor device according to one embodiment of the invention.

The description of the following preferred embodiments may be divided into sections, or based on the respective embodiments, for convenience if necessary, but these embodiments are related to each other except when specified otherwise. One of the embodiments has relationships with respect to the other, including a modified example of a part or all of the other, and a detailed or supplemental description of the other. Further, when referring to the number of components or the like (including the number of pieces, the numeral value, the amount, the range, and the like), the following embodiments are not limited to a specific value except when specified otherwise and except when clearly limited otherwise in principle, and thus may be equal to or more than, or less than the specific value. It is obvious that in the following embodiments, components (including an element, a step, or the like) are not necessarily essential except when specified otherwise and except when clearly considered essential in principle. Similarly, when referring to the shapes, positional relations and the like of the components or the like in the following description of the embodiments, they will include ones substantially analogous or similar to their shapes or the like, unless otherwise specified and considered not to be definitely so in principle. The same goes for the numeral value and range described above.

Now, the preferred embodiments of the invention will be described in detail below based on the accompanying drawings. In all drawings for explaining the embodiments, a member having the same function is designated by the same reference numeral, and thus a repeated description thereof will be omitted below. In the following embodiments, the description of the same or similar parts will not be repeated in principle even when considered necessary.

In the accompanying drawings used in the embodiments, hatching is omitted even in some cross-sectional views for easy understanding. Even in some plan views, hatching is added for easy understanding.

Although in the present application, a field-effect transistor is designated as a metal oxide semiconductor field effect transistor (MOSFET) or a metal insulator semiconductor field effect transistor (MISFET), a nonoxide film is not excluded as a gate insulating film.

The term "hardness" as used in the present application means a Vickers hardness (HV).

A semiconductor device according to one preferred embodiment of the invention will be described below with reference to the accompanying drawings.

Figure 2:
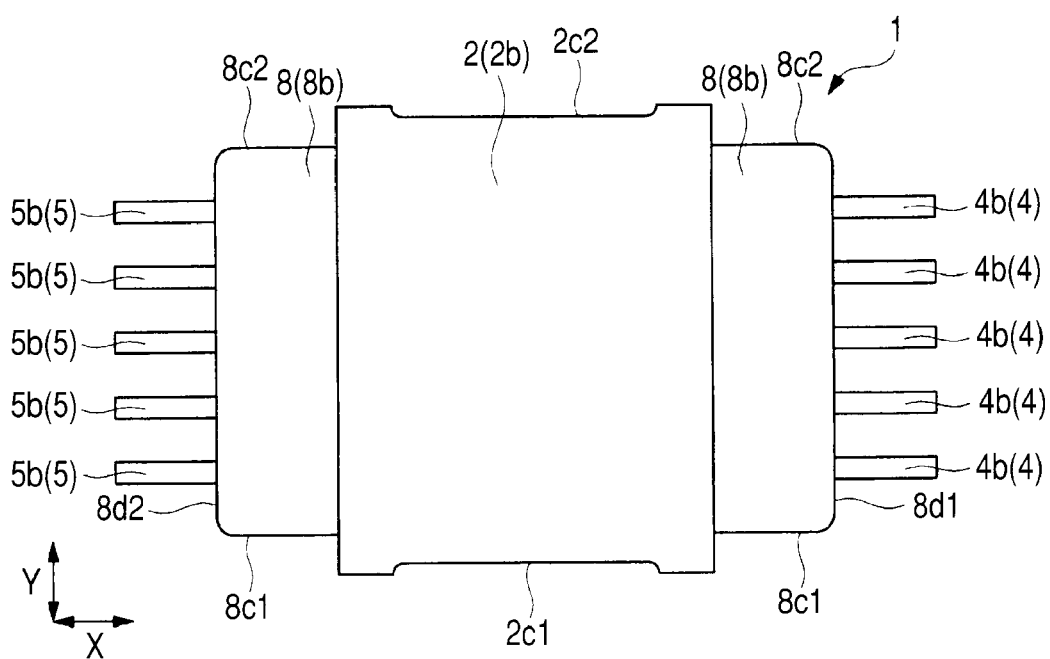
FIG. 2 is a bottom view of the semiconductor device in the embodiment of the invention.
Figure 3:
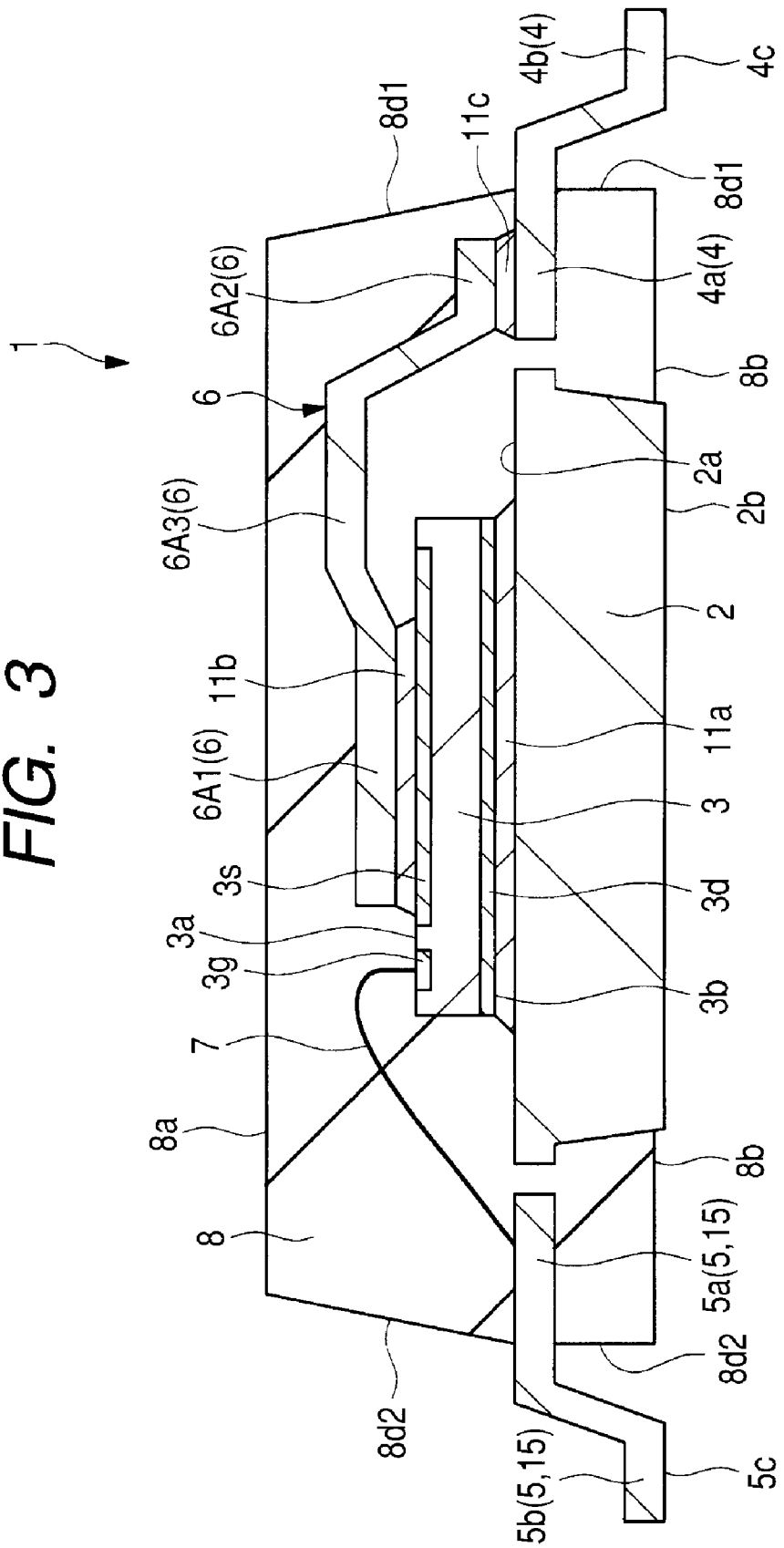
FIG. 3 is a cross-sectional view of the semiconductor device in the embodiment of the invention.
Figure 4:
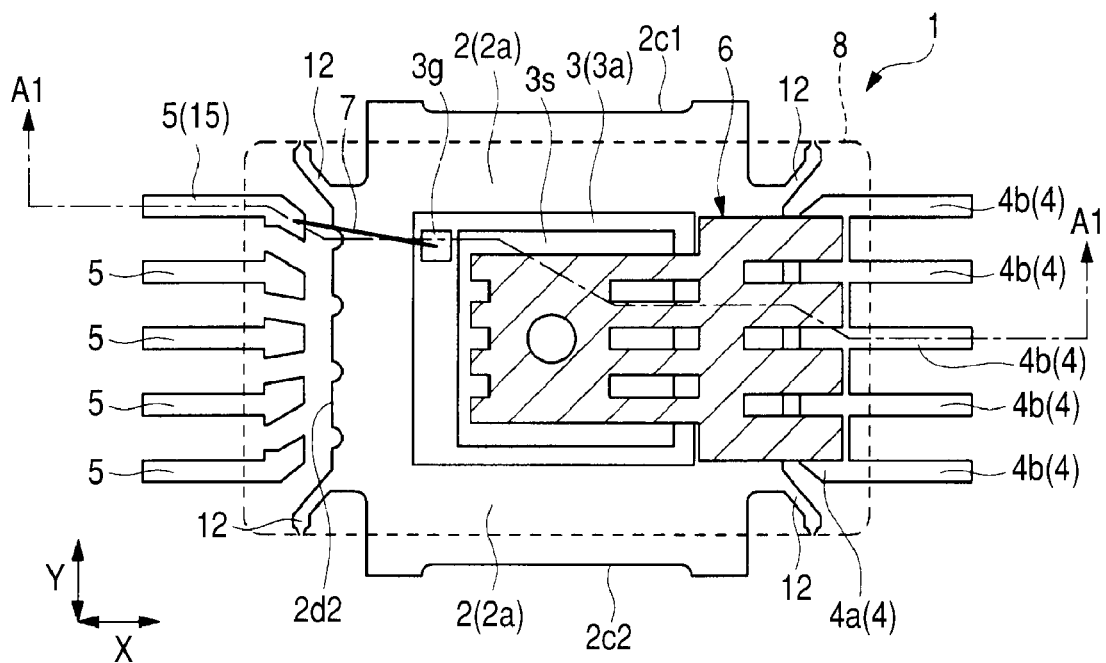
FIG. 4 is a planar perspective diagram of the semiconductor device in the embodiment of the invention.
Figure 5:
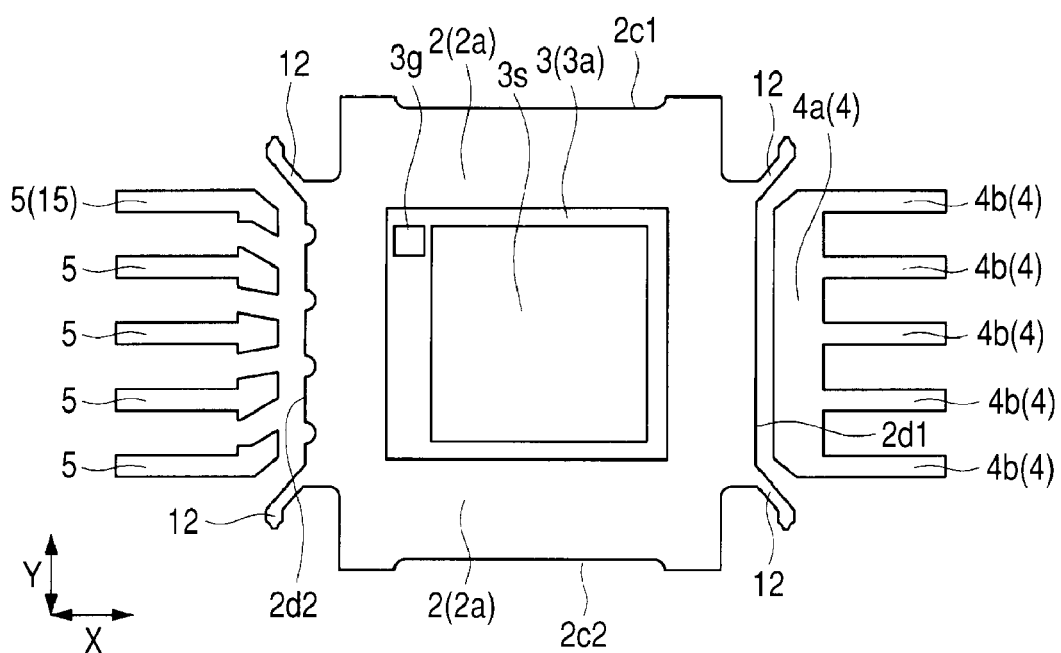
FIG. 5 is another planar perspective diagram of the semiconductor device in the embodiment of the invention.
Figure 6:
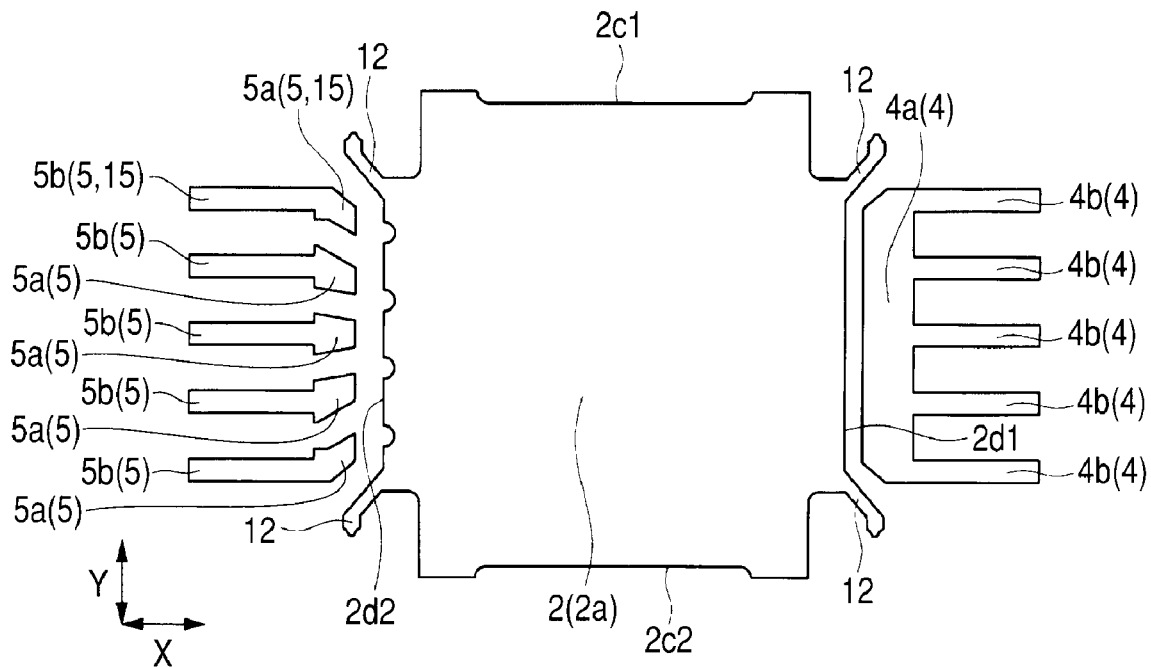
FIG. 6 is a further planar perspective diagram of the semiconductor device in the embodiment of the invention.
Figure 7:
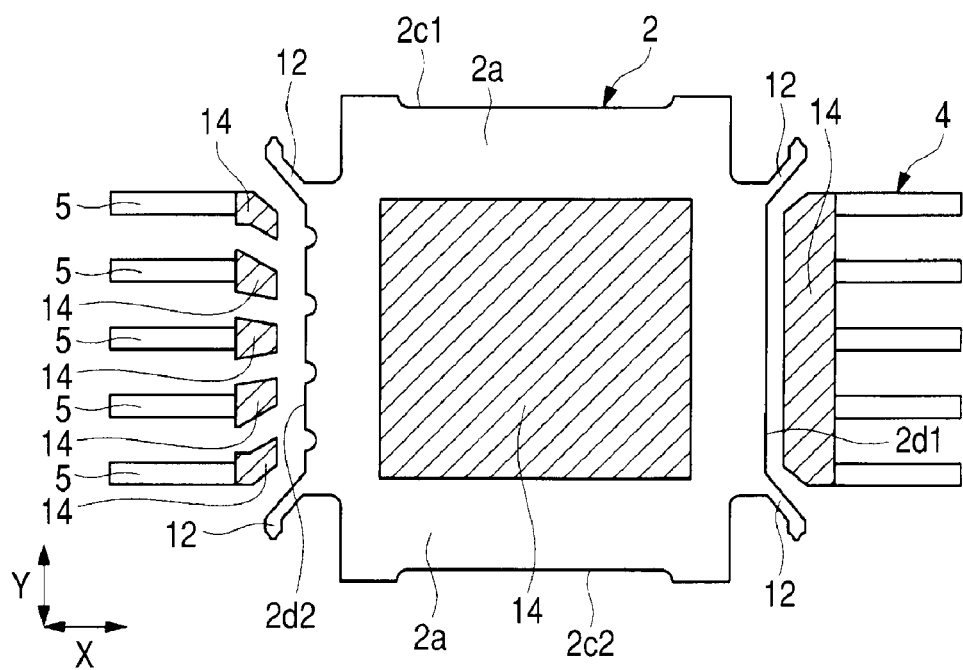
FIG. 7 is a still further planar perspective diagram of the semiconductor device in the embodiment of the invention.
Figure 8:
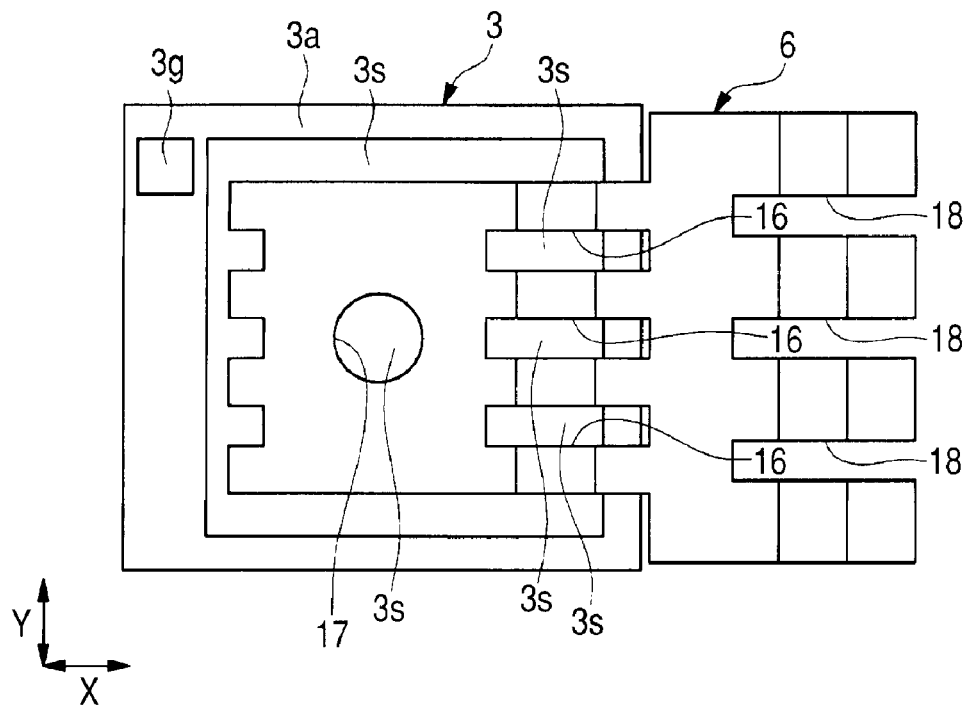
FIG. 8 is a plan view showing a state in which a metal plate is bonded to a semiconductor chip of the semiconductor device in the embodiment of the invention.
Figure 9:
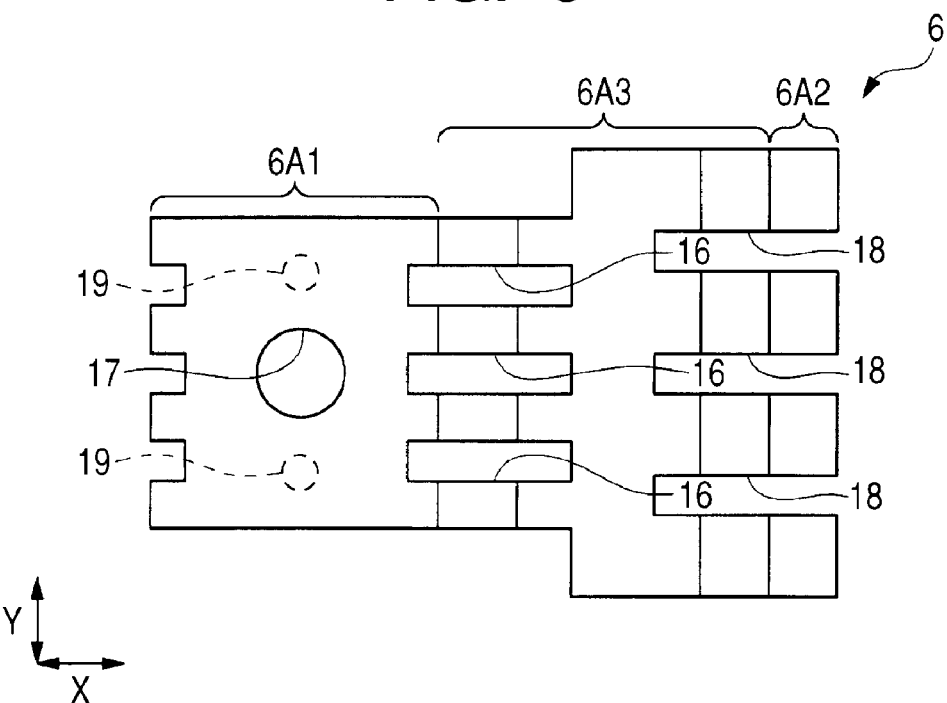
FIG. 9 is a plan view of the metal plate used in the semiconductor device in the embodiment of the invention.

FIG. 1 is a top view (plan view) of a semiconductor device 1 according to one embodiment of the invention. FIG. 2 is a bottom view (base view, back side view, or plan view) of the semiconductor device 1. FIG. 3 is a cross-sectional view (side cross-sectional view) of the semiconductor device 1. The section taken along the line A1-A1 of FIG. 1 (that is, a section taken along the line A1-A1 of FIG. 4) substantially corresponds to FIG. 3. FIG. 4 is a planar perspective diagram of the semiconductor device 1, showing a top perspective diagram (planar perspective diagram) of the semiconductor device 1 as seen through a sealing resin portion 8 from an upper surface of the semiconductor device 1. Although FIG. 4 is the plan view, hatching is drawn over a metal plate 6 in FIG. 4 for easy understanding of the drawings. FIG. 5 is a planar perspective diagram of the semiconductor device 1 with the metal plate 6 removed (as viewed through the metal plate 6) from FIG. 4. FIG. 6 is a planar perspective diagram of the semiconductor device 1 with a semiconductor chip 3 removed (as viewed through the semiconductor chip 3) from FIG. 5. FIG. 7 is a planar perspective diagram of the semiconductor device 1 with a formation area of a plating layer 14 hatched in FIG. 6. Although FIG. 7 is the plan view, hatching is drawn over the metal plate 14 in FIG. 7 for easy understanding. FIG. 8 is a plan view (top view) showing a state in which the metal plate 6 is bonded to the semiconductor chip 3 (a source pad electrode 3s thereof) in the semiconductor device 1. FIG. 8 corresponds to an enlarged view showing only the semiconductor chip 3 and the metal plate 6 extracted from the above-mentioned FIG. 4, while omitting illustration of other members shown in FIG. 4. FIG. 9 is a plan view (top view) of the metal plate 6. Although FIGS. 8 and 9 show the lines indicative of stepped portions on the upper surface of the metal plate 6, FIG. 4 does not illustrate the lines indicative of the stepped portions on the upper surface of the metal plate 6 for easy understanding. A reference numeral X in each plan view indicates a first direction, and a reference numeral Y indicates a second direction orthogonal to the first direction X.

The semiconductor device 1 of this embodiment shown in FIGS. 1 to 7 includes a chip mounting portion 2, the semiconductor chip 3 mounted over the chip mounting portion 2, and lead portions 4 and 5 arranged spaced apart from the chip mounting portion 2. The semiconductor device 1 further includes the metal plate 6 for establishing electrical coupling between the source pad electrode 3s of the semiconductor chip 3 and the lead portion 4, a wire 7 for establishing electrical coupling between a gate pad electrode 3g of the semiconductor chip 3 and the lead portion 5, and the sealing resin portion 8 for sealing these elements.

The sealing resin portion (sealing member, sealing portion, sealing resin, or resin sealing member) 8 is made of, for example, resin material, such as a thermoset resin material, and can contain filler (for example, filler comprised of silica particles). The sealing resin portion 8 can be formed using, for example, epoxy resin containing filler. The resin sealing portion 8 which is a sealing member seals and protects the chip mounting portion 2, the semiconductor chip 3, the lead portions 4 and 5, the metal plate 6, and the wire 7. The sealing resin portion 8 is formed to cover a part of the chip mounting portion 2, a part of the lead portion 4, a part of the lead portion 5, the semiconductor chip 3, the metal plate 6, and the wire 7. The sealing resin portion 8 has two main surfaces positioned opposite to each other, namely, an upper surface (front surface) 8a and a back surface (bottom surface, or lower surface) 8b. The back surface 8b of the sealing resin portion 8 is a back surface (bottom surface, or lower surface) of the semiconductor device 1 to serve as a mounting surface (a surface on the mounting side) of the semiconductor device 1.

In this embodiment, the semiconductor chip 3 in use can be, for example, a semiconductor chip including a longitudinal power MISFET (metal insulator semiconductor field effect transistor) with a trench gate structure. The semiconductor chip 3 has two main surfaces positioned opposite to each other, namely, a front surface (main surface on a semiconductor element formation side, or first main surface) 3a, and a back surface (main surface opposite to the front surface 3a, or second main surface) 3b. The semiconductor chip 3 includes a source pad electrode (front surface electrode, bonding pad, or first electrode) 3s formed in the front surface 3a of the semiconductor chip 3, a gate pad electrode (front surface electrode, bonding pad, or second electrode) 3g, and a back-surface drain electrode (back surface electrode) 3d formed over the entire back surface 3b of the semiconductor chip 3.

The source pad electrode 3s is electrically coupled to a source (source region) of the MISFET formed in the semiconductor chip 3. The gate pad electrode 3g is electrically coupled to a gate electrode of the MISFET formed in the semiconductor chip 3. The back-surface drain electrode 3d is electrically coupled to a drain (drain region) of the MISFET formed in the semiconductor chip 3. Thus, the source pad electrode (first electrode) 3s is an electrode pad for a source (source electrode) of the MISFET formed in the semiconductor chip 3. The gate pad electrode (second electrode) 3g is an electrode pad for the gate electrode of the MISFET formed in the semiconductor chip 3. The back-surface drain electrode (back surface electrode) 3d is a back surface electrode for the drain (drain electrode) of the MISFET formed in the semiconductor chip 3. Among them, the gate pad electrode 3g is an electrode (pad electrode, electrode pad, or bonding pad) for coupling of the wire 7. The source pad electrode 3s is an electrode (pad electrode, electrode pad, or bonding pad) for coupling of the metal plate 6.

Although the semiconductor chip 3 of this embodiment has the source pad electrode 3s and the gate pad electrode 3g formed on the surface 3a of the semiconductor chip 3 as shown in FIG. 5, the arrangement (shapes and positions) of respective electrodes on the surface 3a of the semiconductor chip 3 can be verified as needed. The planar shape of the semiconductor chip 3 is, for example, rectangular. The semiconductor chip 3 is mounted over the chip mounting portion 2 with the gate pad electrode 3g directed toward the lead portion 5, which facilitates coupling between the gate pad electrode 3g and the lead portion 5 via the wire 7.

The chip mounting portion (die pad) 2 and the lead portions 4 and 5 are comprised of a conductive member (metal material). As will be described later, since the chip mounting portion 2 and the lead portions 4 and 5 are formed of the same lead frame (corresponding to the lead frame 41 to be described later), the chip mounting portion 2 and the lead portions 4 and 5 are comprised of the same material (metal material). In this embodiment, the chip mounting portion 2 and the lead portions 4 and 5 are formed of a copper (Cu) alloy. Accordingly, this embodiment can obtain several advantages including good workability, high thermal conductivity, and relatively low cost of the chip mounting portion 2, and the lead portions 4 and 5 (lead frames for the lead portions 4, and 5).

The semiconductor chip 3 is mounted (arranged) over an upper surface 2a of the chip mounting portion 2 such that the back surface 3b of the semiconductor chip 3 (that is, back-surface drain electrode 3d) is opposed to the upper surface 2a of the chip mounting portion 2. The back surface 3b of the semiconductor chip 3 is bonded (coupled or adhered) and fixed to the upper surface 2a of the chip mounting portion 2 via a solder (third solder) 11a which is a conductive bonding material (adhesive material). As mentioned above, the back surface 3b of the semiconductor chip 3 has the back-surface drain electrode 3d formed therein, so that the back-surface drain electrode 3d of the semiconductor chip 3 is bonded and electrically coupled to the chip mounting portion 2 (upper surface 2a thereof) via the solder 11a.

A lower surface (back surface) 2b of the chip mounting portion 2 is exposed to a back surface 8b of the sealing resin portion 8. Sides (end surfaces, ends, or sections) 2c1 and 2c2 of the chip mounting portion 2 are exposed from sides 8c1 and 8c2 of the sealing resin portion 8, and other sides (end surfaces, or ends) 2d1 and 2d2 of the chip mounting portion 2 are covered and sealed with the sealing resin portion 8. The side 2d1 of the chip mounting portion 2 is a side opposed to the lead portion 4 (an inner lead portion 4a thereof), and the side 2d2 of the chip mounting portion 2 is a side opposed to the lead portion 5 (inner lead portion 5a thereof).

The chip mounting portion 2 is bonded and electrically coupled to the back-surface drain electrode 3d on the back surface 3b of the semiconductor chip 3 via the solder 11a, whereby the lower surface 2b of the chip mounting portion 2 exposed from the back surface 8b of the sealing resin portion 8 can act as a terminal (external terminal, or terminal for external coupling) for the drain of the semiconductor device 1. Thus, the chip mounting portion 2 needs to be made of conductive material. Further, the chip mounting portion 2 can act as a member for radiating heat generated in the semiconductor chip 3 (that is, a radiating plate or a member for radiation), and thus preferably has the high thermal conductance. The chip mounting portion 2 needs to have the higher thermal conductance (thermal conductivity) than that of at least the sealing resin portion 8. Thus, like this embodiment, by the use of a copper (Cu) alloy for the chip mounting portion 2, the chip mounting portion 2 can have the high electric conductivity and high thermal conductance, and also has good workability (in formation of the chip mounting portion 2), which is desirable.

In the semiconductor device 1, the semiconductor chip 3 is disposed over the chip mounting portion 2, and the lower surface 2b of the chip mounting portion 2 is exposed from the back surface 8b of the sealing resin portion 8. Thus, the drain of the MISFET formed in the semiconductor chip 3 can be taken from the lower surface 2b of the chip mounting portion 2. And, the heat generated in the semiconductor chip 3 is transferred to the chip mounting portion 2 in use of the semiconductor device 1, and radiated from an exposed part (lower surface 2b) of the mounting portion 2 to the outside of the semiconductor device 1.

Since the thickness of the chip mounting portion 2 is larger than that of the lead portion 4, 5, the heat radiation property can be improved not only by the effect of radiating heat from the exposed part of the chip mounting portion 2 to the outside of the semiconductor device 1, but also by the effect of heat storage because of the thick chip mounting portion 2.

Suspended leads 12 are integrally formed of the same material as the chip mounting portion 2 around the portion 2. Each suspended lead 12 has one end integrally formed with (joined to) the chip mounting portion 2, and extends toward the outside of the chip mounting portion 2 (in the direction apart from the chip mounting portion 2).

Parts of the suspended leads 12 protruding from the sealing resin portion 8 after formation of the sealing resin portion 8 are cut (in a cutting process at step S9 to be described later), and other parts of the suspended leads 12 remaining within the sealing resin portion 8 after cutting among the leads 12 before cutting corresponds to the suspended lead 12 in the semiconductor device 1. The sections (tip surfaces, or end surfaces) of the suspended leads 12 provided by cutting the suspended leads 12 (in the cutting process at the following step S9) are exposed to the sides 8c1 and 8c2 of the sealing resin portion 8.

The semiconductor device 1 includes a plurality of lead portions 5. The respective lead portions 5 are arranged spaced apart from the chip mounting portion 2 and the lead portions 4. Each lead portion 5 includes an inner lead portion 5a which is a part positioned within the sealing resin portion 8 in the lead portion 5, and an outer lead portion 5b which is a part positioned outside the sealing resin portion 8 and protruding from the side 8d2 of the sealing resin portion 8 in the lead portion 5. The lead portions 5 are arranged such that one end of each lead portion 5 (tip end of the inner lead portion 5a) is opposed to the side 2d2 of the chip mounting portion 2, and the outer lead portions 5b of the lead portions 5 are protruded from the side 8d2 of the sealing resin portion 8. A gap between the inner lead portions 5a of the adjacent lead portions 5 is filled with material forming the sealing resin portion (resin material) 8. The chip mounting portion 2 and each lead portion 5 (inner lead portion 5a) are adjacent to each other in the first direction X, and each lead portion 5 (inner lead portion 5a thereof) is arranged spaced apart from the chip mounting portion 2 only by a predetermined distance. A gap between each lead portion 5 (inner lead portion 5a thereof) and the chip mounting portion 2 is filled with the material (resin material) forming the sealing resin portion 8.

The inner lead portion 5a of at least one lead portion 5 among the lead portions 5 is coupled to one end of the wire 7, and the other end of the wire 7 is coupled to the gate pad electrode 3g of the semiconductor chip 3. The wire (bonding wire, or conductive wire) 7 is a conductive wire, preferably, a thin metallic wire, such as gold (Au) wire.

Among the lead portions 5, the lead portion 5 electrically coupled to the gate pad electrode 3g of the semiconductor chip 3 via the wire 7 is hereinafter referred to as a "lead portion (second lead portion) 15" designated by reference character 15. Thus, the gate pad electrode 3g of the semiconductor chip 3 is electrically coupled to the lead portion 15 (inner lead portion 5a thereof) via the wire 7. The wire 7 is a conductive member for establishing electrical coupling between the gate pad electrode 3g and the lead portion 15 (inner lead portion 5a) of the semiconductor chip 3. A plurality of lead portions 15 among the lead portions 5 can also be provided which are electrically bonded to the gate pad electrode 3g of the semiconductor chip 3 via the wire 7. A pad electrode other than the gate pad electrode 3g and the source pad electrode 3s shown in FIG. 5 (note that this pad electrode can be another gate pad electrode or another source pad electrode) is further provided at the front surface 3a of the semiconductor chip 3, whereby the pad electrode and the lead portion 5 (inner lead portion 5a) other than the lead portion 15 can be coupled to each other via the wire 7.

The wire 7 is sealed within the sealing resin portion 8, and is not exposed from the sealing resin portion 8. The outer lead portion 5b of each lead portion 5 is bent and processed in such a manner that a lower surface 5c of the outer lead portion 5b is positioned substantially in the same plane as the lower surface 2b of the chip mounting portion 2. The lead portion 15 is electrically coupled to the gate pad electrode 3g of the semiconductor chip 3 via the wire 7, so that the outer lead portion 5b of the lead portion 15 can serve as a terminal (external terminal, or terminal for external coupling) for the gate of the semiconductor device 1.

The lead portion (first lead portion) 4 has an inner lead portion 4a positioned within the sealing resin portion 8 among the lead portions 4, and an outer lead portion 4b protruding from the side 8d1 of the sealing resin portion 8 and positioned outside the sealing resin portion 8 among the lead portions 4. The outer lead portions 4b are integrally joined to one inner lead portion 4a, thereby forming the lead portion 4. That is, one ends of the outer lead portions 4b in the lead portion 4 are integrally joined to the same inner lead portion 4a within the sealing resin portion 8.

The chip mounting portion 2 and the lead portion 4 (inner lead portion 4a thereof) are adjacent to each other in the first direction X, and the lead portion 4 (inner lead portion 4a thereof) is disposed spaced apart from the chip mounting portion 2 by a predetermined distance. A gap between each lead portion 4 (inner lead portion 4a thereof) and the chip mounting portion 2 is filled with the material (resin material) forming the sealing resin portion 8. The side of the chip mounting portion 2 opposed to the lead portion 4 and the side of the chip mounting portion 2 opposed to the lead portion 5 are side surfaces positioned on opposite sides of the chip mounting portion 2.

The outer lead portions 4b of the lead portion 4 are bent and processed in such a manner that a lower surface 4c of the outer lead portion 4b is positioned substantially in the same plane as the lower surface 2b of the chip mounting portion 2. The inner lead portion 4a of the lead portion 4 is electrically coupled to the source pad electrode 3s of the semiconductor chip 3 via the metal plate 6, so that the outer lead portions 4b of the lead portion 4 can serve as a terminal (external terminal, or terminal for external coupling) for the source of the semiconductor device 1. The metal plate 6 is a conductive member for establishing electrical coupling between the source pad electrode 3s of the semiconductor chip 3 and the lead portion 4 (inner lead portion 4a thereof).

The lower surface 4c of each outer lead portion 4b, the lower surface 5c of each outer lead portion 5b, and the lower surface 2b of the chip mounting portion 2 are positioned substantially in the same plane to one another, but are also in the same plane as the back surface 8b of the sealing resin portion 8 or positioned slightly below the surface 8b.

Preferably, the plating layers 14 made of silver (Ag) or the like are formed over an area of the upper surface 2a of the chip mounting portion 2 with the semiconductor chip 3 mounted thereon via the solder 11a, over an area of the upper surface of the inner lead portion 4a of the lead portion 4 with the metal plate 6 coupled thereto via a solder 11c, and over an area of the inner lead portion 5a of the lead portion 5 with the wire 7 coupled thereto. In FIG. 7, the areas with the plating layers 14 formed thereon are designated by hatching, and in other drawings, illustration of the plating layers 14 is omitted.

The use of copper (Cu) alloy for formation of the chip mounting portion 2 and the lead portions 4 and 5 can have several advantages including good workability, high thermal conductivity, and relatively low cost. However, since the copper (Cu) or copper (Cu) alloy has poor solder wettability, the plating layer is desired to be formed at an area for solder-bonding before solder-bonding with the solder. Thus, the above-mentioned plating layers 14 are formed on the chip mounting portion 2 and the lead portions 4 and 5, and has better solder wettability than other areas of the chip mounting portion 2 and the lead portions 4 and 5 without the plating layer 14.

Coupling (bonding) via the solder is hereinafter referred to as solder bonding, and a part coupled (bonded) via solder is referred to as a solder bonded portion. Thus, the metal plate 6 is respectively solder-bonded or soldered to the source pad electrode 3s of the semiconductor chip 3 and the inner lead portion 4a of the lead portion 4. The semiconductor chip 3 is solder-bonded or soldered to the chip mounting portion 2.

The plating layer 14 in use can be a silver (Ag) plating layer, a nickel-palladium (Ni—Pd) plating layer, a gold (Au) plating layer, a nickel (Ni) plating layer, or the like. From the viewpoint of improvement of the solder wettability, the silver (Ag) plating layer or the gold (Au) plating layer is preferable, and also from the viewpoint of reduction in cost, the silver (Ag) plating layer is most preferable. The thickness of the plating layer 14 is, for example, about 2 to 3 μm.

Provision of the plating layers 14 on the upper surfaces of the chip mounting portion 2 and the inner lead portion 4a of the lead portion 4 can suppress the spread of wetting of the solders 11a and 11c at the chip mounting portion 2 and the inner lead portion 4a of the lead portion 4, thus enabling improvement of bonding properties between the semiconductor chip 3 and the chip mounting portion 2, and between the metal plate 6 and the inner lead portion 4a of the lead portion 4.

Provision of the plating layer 14 at the area with the wire 7 coupled thereto (contacting) at the upper surface of the inner lead portion 5a of the lead portion 5 can improve stability of contact bonding between the wire 7 and the inner lead portion 5a of the lead portion 5.

In this embodiment, the electrical coupling between the source pad electrode 3s of the semiconductor chip 3 and the inner lead portion 4a of the lead portion 4 is performed not by a wire, but by the metal plate (clip) 6. The metal plate 6 is bonded and electrically coupled to the source pad electrode 3s of the semiconductor chip 3 via the solder (first solder) 11b, which is a conductive bonding material (adhesive material). Further, the metal plate 6 is bonded and electrically coupled to the inner lead portion 4a of the lead portion 4 via the solder (second solder) 11c, which is a conductive bonding material (adhesive material). Thus, the source pad electrode 3s of the semiconductor chip 3 is electrically coupled to the lead portion 4 (inner lead portion 4a thereof) via the metal plate 6, which can reduce on-resistance of the MISFET formed in the semiconductor chip 3 as compared to the case of coupling between the source pad electrode 3s of the semiconductor chip 3 and the lead portion 4 via the wire. Thus, a package resistance can be decreased and a conduction loss can also be reduced.

The metal plate 6 can be formed of metal (metallic material) having high electrical conductivity and thermal conductivity, such as copper (Cu), a copper (Cu) alloy, aluminum (Al), or an aluminum (Al) alloy.

Especially, from the viewpoint of good workability, high thermal conductivity, and relatively low cost, the copper (Cu) or copper (Cu) alloy is preferably used. In this embodiment, the metal plate 6 in use is made of copper-based material. The material for the metal plate 6 is not copper (Cu) or a copper (Cu) alloy simply selected, but is preferably formed of oxygen-free copper so as to make the hardness thereof lower by decreasing its softening temperature. In contrast, the chip mounting portion 2 and the lead portions 4 and 5 are preferably formed of a copper (Cu) alloy so as to increase its softening temperature to make the hardness thereof higher. This is based on the following reasons. In order to improve the reliability of coupling of the solder bonded portion between the metal plate 6 and the source pad electrode 3s and the inner lead portion 4a, it is effective to reduce the hardness of the metal plate 6. In order to facilitate the manufacture of the semiconductor device 1, it is effective to make the hardness of each of the chip mounting portion 2 and the lead portions 4 and 5 higher. That is, in the semiconductor device 1 of this embodiment, the hardness of the metal plate 6 (Vickers hardness) is lower than that of each of the chip mounting portion 2 and the lead portions 4 and 5. This feature is achieved by making the metal plate 6 with oxygen-free copper, and making the chip mounting portion 2 and the load portions 4 and 5 with the copper alloy. This will be described more specifically below. The term "hardness" as used in the present application means "Vickers hardness (HV)".

Thus, in this embodiment, the metal plate 6 formed of a metal material (here, oxygen-free copper) which is lower cost than gold is used instead of using a plurality of wires formed of gold (Au), which can reduce cost of the semiconductor device 1. The dimensions (widths) of the metal plate 6 in the first direction X and the second direction Y are respectively larger than the diameter of the wire 7. The formation of the metal plate 6 of copper-based material (here, oxygen-free copper) can have several advantages including good workability, and high thermal conductivity.

The metal plate 6 is sealed within the sealing resin portion 8, and not exposed from the sealing resin portion 8. As shown in FIGS. 3 and 9, the metal plate 6 integrally has a first part 6A1, second parts 6A2, and a third part 6a3 to be described later.

The first part (chip contact portion) 6A1 is a part bonded and electrically coupled to the source pad electrode 3s of the semiconductor chip 3 via the solder 11b. The first part 6A1 is superimposed over a part of the semiconductor chip 3 in a planar manner, and is formed flatly along the main surface (front surface 3a) of the semiconductor chip 3 as viewed in the cross-sectional direction in FIG. 3.

The second parts (lead contact parts) 6A2 are ones bonded and electrically coupled to the inner lead portion 4a of the lead portion 4 via the solder 11c. Each second part 6A2 is superimposed over a part of the inner lead portion 4a of the lead portion 4, and is formed flatly along the main surface (front surface) of the inner lead portion 4a of the lead portion 4 as viewed in the cross-sectional direction in FIG. 3.

The third part (intermediate part) 6A3 is a part coupling (joining) the first part 6A1 with the second parts 6A2. The third part 6A3 extends (exists extending) from one side of the first part 6A1 in the second direction Y intersecting the side (preferably, orthogonal to the side) to the second parts 6A2 over the inner lead part 4a across the side of the semiconductor chip 3 (the side of the chip opposed to the lead portion 4). That is, the third part 6A3 and the second parts 6A2 are provided to extend from the side of the first part 6A1 in the second direction Y so as to couple the first part 6A1 to the inner lead portion 4a.

As viewed in the cross-sectional direction in FIG. 3, the third part 6A3 is located between the semiconductor chip 3 and the inner lead portion 4a at a higher level than that of each of the first part 6A1 and the second part 6A2 so as to get away from the main surface (front surface 3a) of the semiconductor chip 3. That is, the third part 6A3 of the metal plate 6 has such a shape as to be spaced apart from the semiconductor chip 3 not to be in contact with the peripheral edge of the semiconductor chip 3. Thus, the solder 11b can be less apt to leak toward the side of the semiconductor chip 3, thereby preventing defective conduction between the front surface 3a (source pad electrode 3s thereof) and the back surface 3b (back-surface drain electrode 3d thereof) of the semiconductor chip 3 due to the leakage of the solder 11b.

The term "height" as used herein means a distance from the lower surface 2b of the chip mounting portion 2 as reference to a target position separated therefrom in the direction of thickness of the sealing resin portion 8 (in the direction orthogonally intersecting the front surface 3a and the back surface 3b of the semiconductor chip 3). The solders 11b and 11c are preferably formed of the same solder material.

The plating layers (not shown) are more preferably formed on the lower surface of the first part 6A1 of the metal plate 6 (at the area bonded to the source pad electrode 3s of the semiconductor chip 3 via the solder 11b), and on the lower surface of the second part 6A2 of the metal plate 6 (at the area bonded to the inner lead portion 4a of the lead portion 4 via the solder 11c). Suitable materials (metal materials) for the plating layer are the same as those exemplified as preferable materials (metal materials) for the above-mentioned plating layer 14. The reason for providing the plating layer over the metal plate 6 is substantially the same as the case of providing the above plating layer 14 over the chip mounting portion 2 and the lead portion 4. Provision of the plating layer (most preferably, silver plating layer) on the lower surface of the first part 6A1 and the lower surface of the second part 6A2 of the metal plate 6 can further enhance the strength of bonding between the metal plate 6 and each of the source pad electrode 3s of the semiconductor chip 3 and the inner lead portion 4a of the lead portion 4.

The metal plate 6 is disposed so as to cover a part of the surface 3a of the semiconductor chip 3 serving as a heating source. Thus, the semiconductor chip 3 is sandwiched between the metal plate 6 and the chip mounting portion 2. That is, heat generated in the semiconductor chip 3 is dissipated (radiated) from the back surface 3b of the semiconductor chip 3 through the chip mounting portion 2, and additionally, dissipated (radiated) from the front surface 3a of the semiconductor chip 3 through the metal plate 6. As a result, the heat dissipation property (heat radiation property) of heat generated in the semiconductor chip 3 can be improved.

The area of the first part 6A1 of the metal plate 6 is preferably smaller than the area of the main surface (front surface 3a) of the semiconductor chip 3, and the area of the arranged region of the source pad electrode 3s. Preferably, the metal plate 6 has the first part 6A1 accommodated within the main surface (front surface 3a) of the semiconductor chip 3, and is arranged so as not to extend off the semiconductor chip 3. This arrangement can prevent the leakage of the material of the solder 11b toward the side of the semiconductor chip 3, thus preventing the defective conduction between the front surface 3a (source pad electrode 3s thereof) and the back surface 3b (back-surface drain electrode 3d thereof) of the semiconductor chip 3 due to the leakage of the solder 11b.

The four corners of the semiconductor chip 3 are not preferably covered with the metal plate 6. That is, the metal plate 6 is not located above each of the four corners of the semiconductor chip 3, and the four corners of the semiconductor chip 3 are preferably exposed from the metal plate 6. Thus, in an appearance inspection performed after bonding of the metal plate 6 and before formation of the sealing resin portion 8, the state of the solder 11b coupling the metal plate 6 to the semiconductor chip 3 (source pad electrode 3s thereof) can be observed at the four corners of the semiconductor chip 3. As a result, the reliability and yield of the semiconductor device 1 can be enhanced.

As shown in FIG. 9 and the like, openings (holes, or through holes) 16 are formed at the third part (intermediate part) 6A3 of the metal plate 6. The opening 16 is formed to extend from the first part 6A1 side to the second part 6A2 side (that is, in the first direction X) at the third part (intermediate part) 6A3 of the metal plate 6. Preferably, each opening 16 has a rectangular planar shape with the dimension in the first direction X set larger than the dimension in the second direction Y. In the metal plate 6, one or more openings 16 are preferably formed, especially, a plurality of (here, three) openings 16 are more preferably formed.

Provision of the openings 16 causes the metal plate 6 to be easily deformed by a thermal stress, which can reduce load on a solder bonded portion (solder 11b) between the metal plate 6 and the semiconductor chip 3 (source pad electrode 3a thereof), or on a solder bonded portion (solder 11c) between the metal plate 6 and the inner lead portion 4a of the lead portion 4. That is, the stress or distortion can be reduced, which can further improve the reliability of the semiconductor device 1.

As shown in FIG. 8, the opening 16 provided in the metal plate 6 is superimposed over a part of the source pad electrode 3s provided at the front surface 3a of the semiconductor chip 3 in a planar manner, while the metal plate 9 is bonded to the semiconductor chip 3 (source pad electrode 3a thereof) (after a solder reflow process at step S4 to be described later). That is, a part of the source pad electrode 3s of the semiconductor chip 3 is exposed from the opening 16 of the metal plate 6 as viewed from above the semiconductor chip 3. In short, the opening 16 of the metal plate 6 extends up to the source pad electrode 3s of the semiconductor chip 3 across the side of the chip 3 (the side opposed to the inner lead portion 4a of the lead portion 4) when viewed in a planar manner.

By providing such openings 16, the state and amount of the solder 11b for bonding the first part 6A1 of the metal plate 6 to the source pad electrode 3s of the semiconductor chip 3 can be observed by the appearance inspection from the openings 16 of the metal plate 6 before a molding (resin sealing) process at step S7 to be described later (preferably, after the solder reflow process in step S4 to be described later and before a wire bonding process in step S6 to be described later). That is, whether or not the amount of solder 11b is excessive (whether or not the solder 11b overflows from the area on the source pad electrode 3a) can be observed (ascertained) from the opening 16 of the metal plate 6. When the amount of solder 11b is determined to be excessive by the observation from the opening 16 of the metal plate 6, the source pad electrode 3s of the front surface 3a of the semiconductor chip 3, and one side of the semiconductor chip 3 (which is at a drain potential) can be short circuited via the solder 11b. The excessive part of the solder 11b may be selected and removed. In the following steps, only semiconductor chips which are determined to have good state and amount of the solder 11b can be transferred. Thus, the reliability of the semiconductor device 1 can be further improved, and the occurrence of failures, such as short-circuiting, can be found out even before the manufacturing of the semiconductor device 1 is completed in the last step of assembly. Further, the manufacturing cost of the semiconductor device 1 can be reduced, and the yield of manufacturing the device 1 can be improved.

As shown in FIG. 9 and the like, the first part 6A1 of the metal plate 6 has an opening (hole, or through hole) 17 formed therein. The opening 17 preferably has a circular planar shape. The first part 6A1 of the metal plate 6 preferably has one or more openings 17 formed therein. Provision of the openings 17 causes the metal plate 6 to be easily deformed by a thermal stress, which can reduce load on a solder bonded portion (solder 11b) between the metal plate 6 and the semiconductor chip 3 (source pad electrode 3s thereof), or on a solder bonded portion (solder 11c) between the metal plate 6 and the inner lead portion 4a of the lead portion 4. That is, the stress and distortion can be reduced, which can further improve the reliability of the semiconductor device 1.

As shown in FIG. 9, the second parts 6A2 and the third part 6A3 of the metal plate 6 are provided with slits (cutout portions, or division slots) 18. That is, the metal plate 6 is provided with the slits 18 from the second part 6A2 to the midway point of the third part 6A3. The second part 6A2 and the third part 6A3 of the metal plate 6 are divided into a plurality of parts by the slits 18 to form a planar comb-like shape. As shown in FIG. 9, each of the openings 16 and 17 has its periphery surrounded by a metal plate forming the metal plate 6. Each slit 18 has one end opened while not surrounded by a metal plate forming the metal plate 6.

Provision of the slits 18 in the metal plate 6 causes the metal plate 6 to be easily deformed by a thermal stress, which can reduce load on a solder bonded portion (solder 11b) between the metal plate 6 and the semiconductor chip 3 (source pad electrode 3s thereof), or on a solder bonded portion (solder 11c) between the metal plate 6 and the inner lead portion 4a of the lead portion 4. That is, the stress and distortion can be reduced, which can further improve the reliability of the semiconductor device 1.

Provision of the slits 18 in the metal plate 6 can make sure (observe) whether or not the solder 11c flows through the lower surface of the metal plate 6 to move to the semiconductor chip 3, from the slits 18 of the metal plate 6 in the appearance inspection. Thus, the reliability of the semiconductor device 1 can be further improved. The occurrence of failure, such as short-circuiting, can be found out more accurately even before the manufacturing of the semiconductor device 1 is completed in the last step of assembly, which can further reduce the manufacturing cost of the semiconductor device 1, improving the yield of manufacturing the device 1.

As indicated by a dotted line in FIG. 9, the lower surface of the first part 6A1 of the metal plate 6 (the surface opposed to the front surface 3a of the semiconductor chip 3) can be provided with protrusions (protruding portion, projection, or convex portion) 19. The protrusion 19 can be a protrusion formed, for example, in a columnar shape, or a semi-circular shape. The provision of the protrusions 19 on the lower surface of the first part 6A1 of the metal plate 6 defines the thickness of the solder 11b by the height of the protrusions 19, so that the thickness of the solder 11b can be forcedly ensured. Thus, the solder 11b located between opposed surfaces of the metal plate 6 (first part 6A1) and the semiconductor chip 3 can be thickened, so that the thickness of the solder 11b can be made uniform between the opposed surfaces of the metal plate 6 (first part 6A1) and the semiconductor chip 3. Thus, the metal plate 6 can be suppressed or prevented from being inclined with respect to the front surface 3a of the semiconductor chip 3. Furthermore, a bonding force between the metal plate 6 and the semiconductor chip 3 (source pad electrode 3s thereof) can be further improved.

The lower surface of the first part 6A1 of the metal plate 6 is preferably provided with two or more protrusions 19. The protrusions 19 preferably have the same height, which can prevent the metal plate 6 from being inclined with respect to the front surface of the semiconductor chip 3.

Next, the structure of the semiconductor chip 3 will be described.

Figure 10:
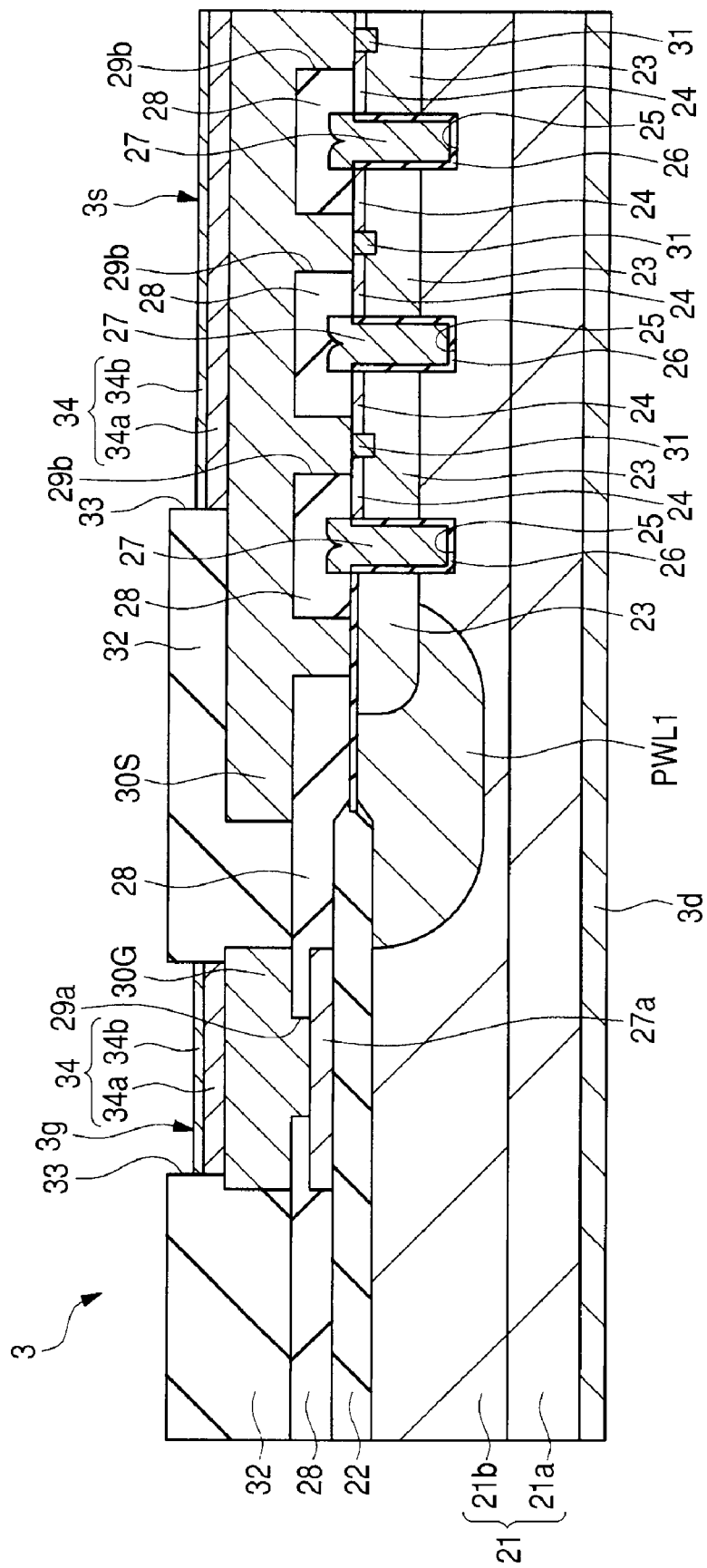
FIG. 10 is a cross-sectional view of a main portion of the semiconductor chip used in the semiconductor device in the embodiment of the invention.
Figure 11:
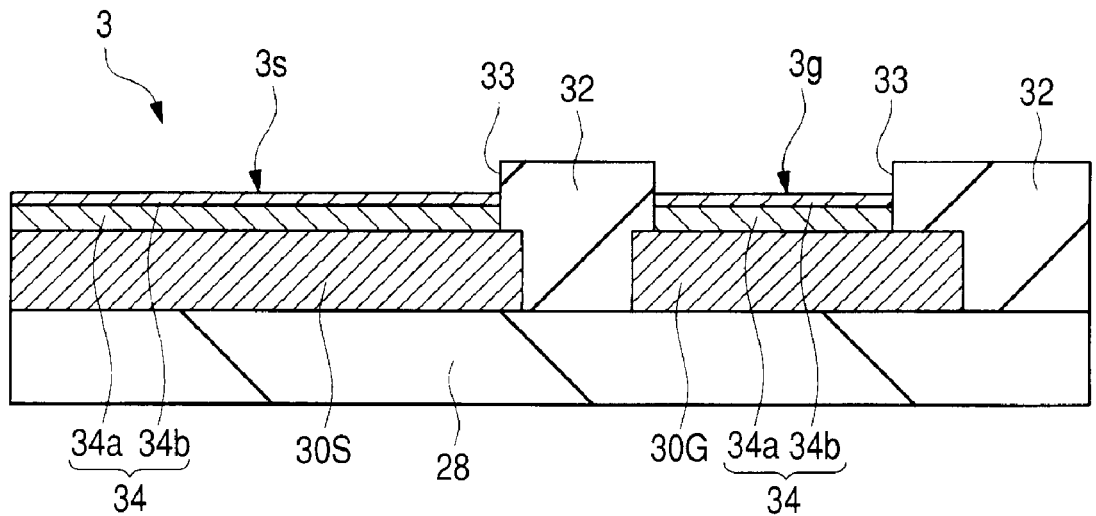
FIG. 11 is another cross-sectional view of a main portion of the semiconductor chip used in the semiconductor device in the embodiment of the invention.
Figure 12:
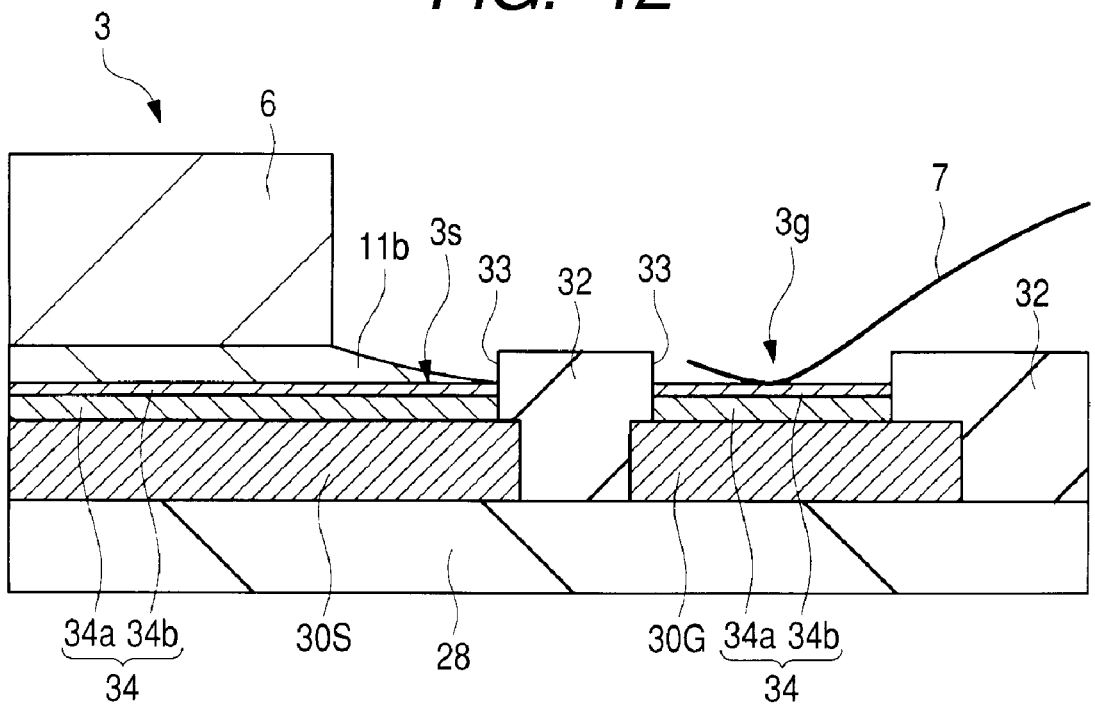
FIG. 12 is a further cross-sectional view of a main portion of the semiconductor chip used in the semiconductor device in the embodiment of the invention.

FIG. 10 is a cross-sectional view of a main part of the semiconductor chip 3. FIG. 11 is a cross-sectional view of the other part of the semiconductor chip 3, showing an upper layer structure with respect to the insulating film 28. FIG. 12 is a cross-sectional view showing the structure with the metal plate 6 and the wire 7 added thereto in FIG. 11.

As shown in FIG. 10, a semiconductor substrate (hereinafter, referred to as a substrate) 21 forming the semiconductor chip 3 includes a substrate body (semiconductor substrate, or semiconductor wafer) 21a made of $n^+$-type monocrystalline silicon doped with, for example, arsenic (As), and an epitaxial layer (semiconductor layer) 21b formed on the main surface of the substrate body 21a and made of $n^-$-type monocrystalline silicon. Thus, the substrate 21 is a so-called epitaxial wafer. A field insulating film (element isolation region) 22 made of, for example, silicon oxide or the like, is formed on the main surface of the epitaxial layer 21b. A plurality of unit transistor cells forming a power MOSFET are formed in an active region enclosed by the field insulating film 22 and a p-type well PWL1 as a lower layer. The power MOSFET is formed by coupling the unit transistor cells in parallel to each other. Each unit transistor cell is formed by, for example, an n-channel type power MOSFET with a trench gate structure.

The substrate body 21a and the epitaxial layer 21b have a function as the drain region of the unit transistor cell described above. The back-surface drain electrode 3d which is a back surface electrode for the drain electrode is formed on the back surface of the substrate 21 (semiconductor chip 3). The back-surface drain electrode 3d is formed by laminating a titanium (Ti) layer, a nickel (Ni) layer, and a gold (Au) layer in that order from the back surface side of the substrate 21. In the semiconductor device 1, the back-surface drain electrode 3d of the semiconductor chip 3 is bonded and electrically coupled to the chip mounting portion 2 via the solder 11a.

A p-type semiconductor region 23 formed in an epitaxial layer 21b has a function as a channel formation region of the unit transistor cell. Further, a part of an $n^+$-type semiconductor region 24 formed above the p-type semiconductor region 23 has a function as the source region of the unit transistor cell. Thus, the semiconductor region 24 is a semiconductor region for a source.

The substrate 21 is provided with slots 25 extending from the main surface thereof in the thickness direction of the substrate 21. The slot 25 penetrates from the upper surface of the $n^+$-type semiconductor region 24 through the $n^+$-type semiconductor region 24 and the p-type semiconductor region 23, and ends in the epitaxial layer 21b as a lower layer. A gate insulating film 26 made of, for example, silicon oxide, is formed on the bottom and side surfaces of the slot 25. A gate electrode 27 is embedded in each slot 25 via the gate insulating film 26. The gate electrode 27 is comprised of, for example, a polysilicon film to which n-type impurities (for example, phosphorus) are added. The gate electrode 27 has a function as the gate electrode of the unit transistor cell. A wiring portion 27a for extraction of the gate is comprised of a conductive film on the same layer as the gate electrode 27, and is formed on a part of the field insulating film 22. The gate electrode 27 and the wiring portion 27a for extraction of the gate are integrally formed and electrically coupled to each other. In an area not shown in the cross-sectional view of FIG. 10, the gate electrode 27 is integrally coupled to the wiring portion 27a for extraction of the gate. The wiring portion 27a for extraction of the gate is electrically coupled to the gate wiring 30G through a contact hole 29a formed in the insulating film 28 covering a part of the wiring portion.

A source wiring 30S is electrically coupled to the $n^+$-type semiconductor region 24 for the source through a contact hole 29b formed in the insulating film 28. The source wiring 30S is located above the p-type semiconductor region 23, and electrically coupled to a $p^+$-type semiconductor region 31 formed between the adjacent $n^+$-type semiconductor regions 24, and also to the p-type semiconductor region 23 for formation of a channel through the region 31. The gate wiring 30G and the source wiring 30S can be formed by forming a metal film, for example, an aluminum film (or an aluminum alloy film) in the insulating film 28 with contact holes 29a and 29b formed therein so as to fill contact holes 29a and 29b, and patterning the metal film (aluminum film or aluminum alloy film). Thus, the gate wiring 30G and the source wiring 30S each are comprised of an aluminum film or an aluminum alloy film.

The gate wiring 30G and the source wiring 30S are partially covered with a protective film (insulating film) 32 comprised of polyimide resin or the like. The protective film 32 is a film (insulating film) located as the uppermost layer of the semiconductor chip 3.

Openings 33 are formed in parts of the protective film 32 to expose parts of the gate wiring 30G and the source wiring 30S as the lower layer. The gate wiring 30G part exposed from the opening 33 is the gate pad electrode 3g, which is a pad for the gate electrode, and the source wiring 30S part exposed from the opening 33 is the source pad 3s, which is a pad for the source electrode.

Metal layers 34 are formed over the surfaces of the gate pad electrode 3g and the source pad electrode 3s (that is, over the part of the gate wiring 30G and the part of the source wiring 30S which are exposed at the bottom of the openings 33) by a plating method or the like. The metal layer 34 is formed of a lamination comprised of a metal layer 34a formed over the gate wiring 30G or the source wiring 30S, and the metal layer 34b formed thereon. The metal layer 34a as the lower layer is comprised of, for example, nickel (Ni), and has a main function of suppressing or preventing oxidation of aluminum of the gate wiring 30G and the source wiring 30s as an underlayer. The metal layer 34b as an upper layer is formed of, for example, gold (Au), and has a main function of suppressing or preventing oxidation of nickel of the metal layer 34a as the underlayer.

In the semiconductor device 1, as shown in FIG. 12, the metal plate 6 is bonded to the source pad electrode 3s of the semiconductor chip 3 via the solder 11b, and the wire 7 is coupled to the gate pad electrode 3g of the semiconductor chip 3.

The metal layers 34 are formed at the surfaces of the gate pad electrode 3g and the source pad electrode 3s, which can suppress and prevent oxidation of the aluminum surfaces of the gate wiring 30G and the source wiring 30S. Thus, the bonding property (solder wettability) of the solder 11b to the source pad electrode 3s can be improved, so that a bonding force between the metal plate 6 and the source pad electrode 3s can be improved. Further, an increase in resistance of a coupling part between the metal plate 6 and the source pad electrode 3s can be avoided.

An operating current of the unit transistor formed in the semiconductor chip 3 flows through between the epitaxial layer 21b for the drain, and the $n^+$-type semiconductor region 24 for the source along the side of the gate electrode 27 (that is, the side of the slot 25) in the thickness direction of the substrate 21. That is, the channel is formed along the thickness direction of the semiconductor chip 3.

Thus, the semiconductor chip 3 is a semiconductor chip having a longitudinal type MOSFET (power MOSFET) formed therein with a trench gate structure. The longitudinal MOSFET corresponds to a MOSFET in which current between the source and drain flows in the thickness direction (in the direction substantially orthogonal to the main surface of the semiconductor substrate) of the semiconductor substrate (substrate 21).

Now, a manufacturing procedure (assembly process) of the semiconductor device according to this embodiment will be described below.

Figure 13:
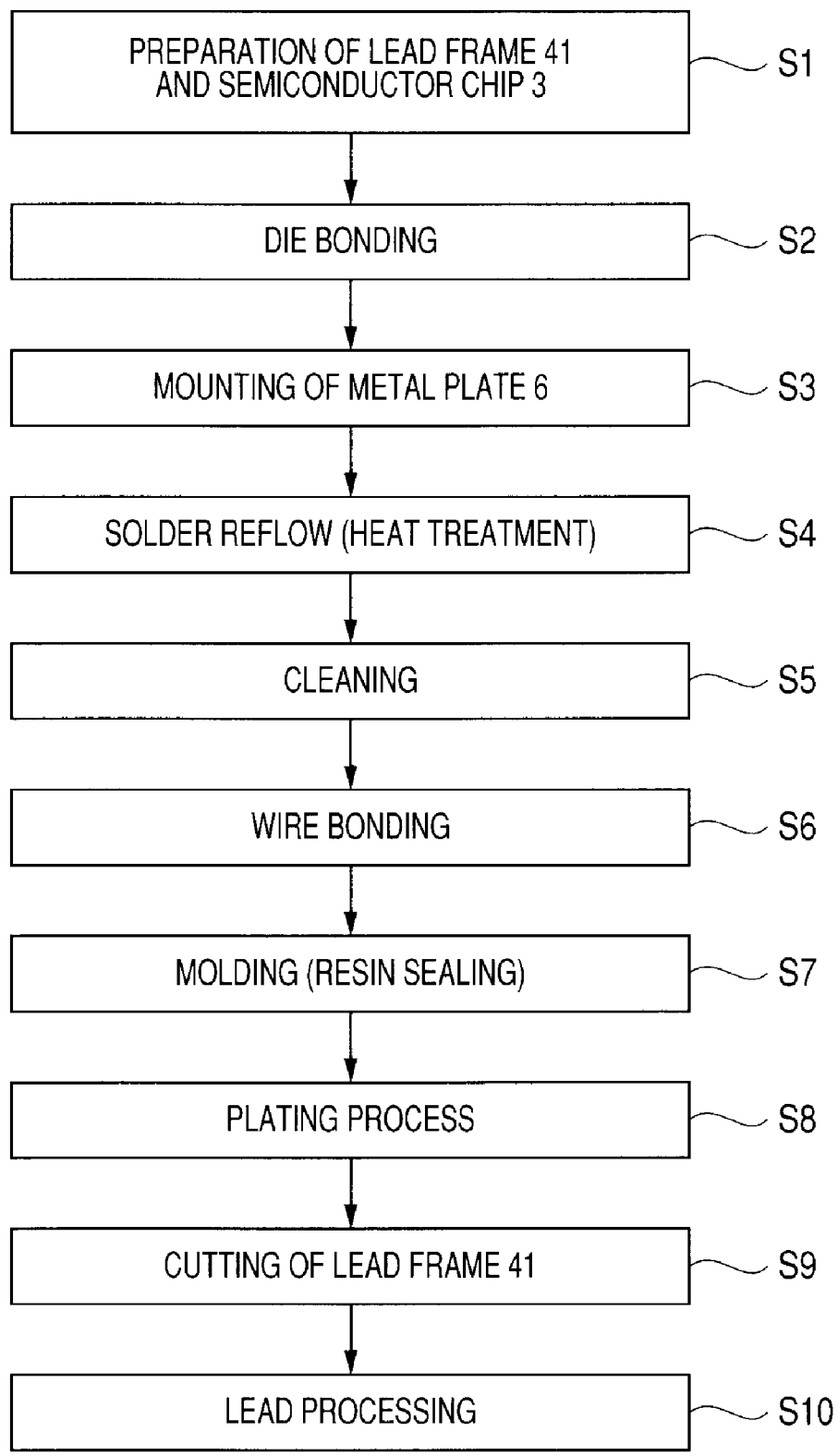
FIG. 13 is a manufacturing process flowchart showing a manufacturing procedure (assembly process) of the semiconductor device in the embodiment of the invention.
Figure 14:
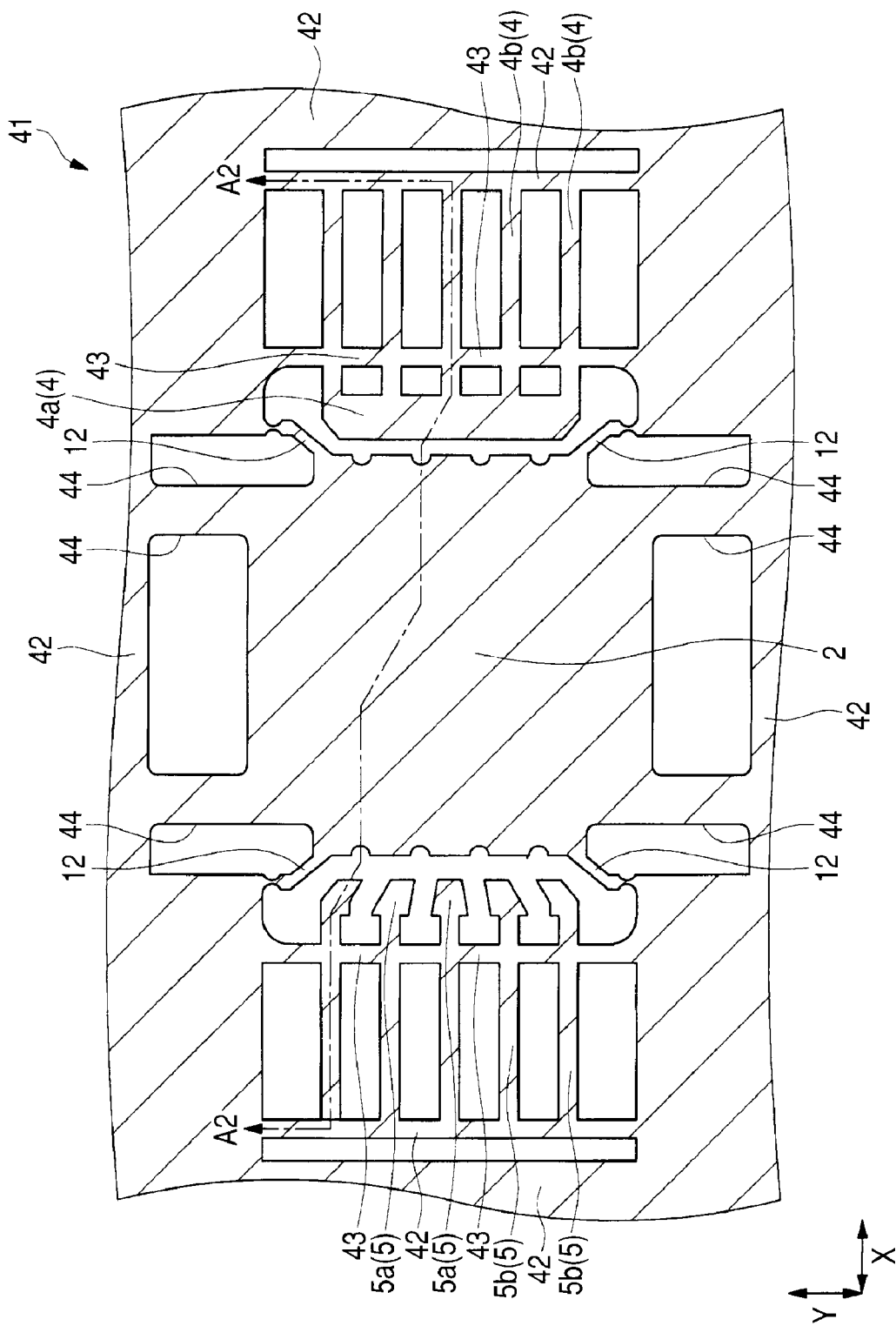
FIG. 14 is a plan view of a lead frame used for manufacturing the semiconductor device in the embodiment of the invention.
Figure 15:
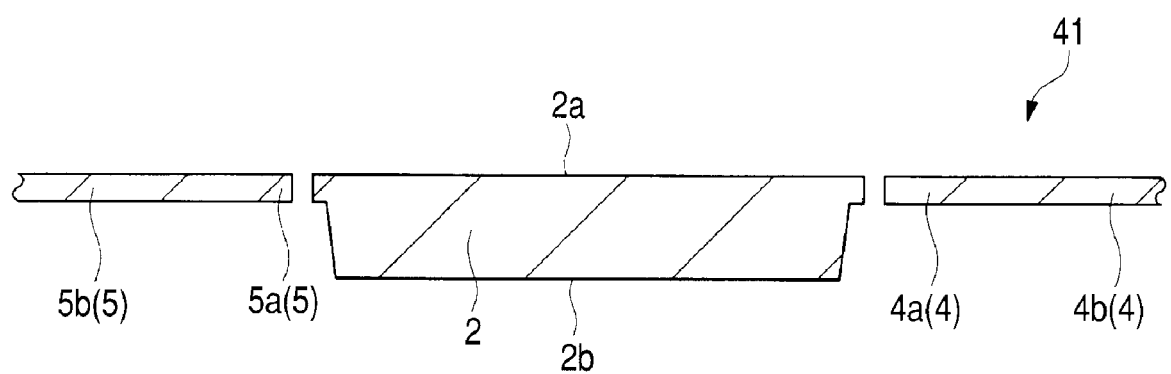
FIG. 15 is a cross-sectional view of the lead frame shown in FIG. 14.

FIG. 13 is a manufacturing process flowchart (procedure flowchart) showing the manufacturing procedure (assembly process) of the semiconductor device in this embodiment. FIG. 14 is a plan view (top view) of a lead frame 41 used in the manufacture (assembly) of the semiconductor device of this embodiment. FIG. 15 is a cross-sectional view of the lead frame 41. FIG. 14 shows an area corresponding to one semiconductor package (an area from which one semiconductor device 1 is manufactured). The lead frame 41 is actually a multiple lead frame provided by coupling (repeating) a plurality of unit structures, each of which is the structure shown in FIG. 14. The sectional view of FIG. 15 substantially corresponds to the section taken along the line A2-A2 shown in FIG. 14, and also to that shown in FIG. 3. FIG. 14 is a plan view, and for easy understanding, the lead frame 41 is indicated by hatching in FIG. 14.

In manufacturing (assemblying) the semiconductor device 1, first, the lead frame 41 and the semiconductor chip 3 are prepared (in step S1 shown in FIG. 13).

The lead frame 41 used in manufacturing the semiconductor device 1 integrally includes the chip mounting portion 2 and the lead portions 4 and 5 which are required to form the semiconductor device 1. That is, as shown in FIGS. 14 and 15, the lead frame 41 includes a frame 42, and the chip mounting portion 2 and the lead portions 4 and 5 which are integrally joined (coupled) to the frame 42. The lead frame 41 includes tie bars (dam bars, joints) 43 for joining a plurality of adjacent outer lead portion 4b to a plurality of adjacent outer lead portions 5b. The adjacent outer lead portions 4b are joined together by the tie bar 43. The adjacent outer lead portions 5b are joined together by the tie bar 43. The chip mounting portion 2 is joined (coupled) to the frame 42 via the suspended lead portion 12. The chip mounting portion 2, the lead portions 4 and 5, the suspended lead portion 12, the frame 42, and the tie bars 43, which form the lead frame 41, are integrally formed of the same material. The lead frame 41 is formed of a copper alloy, which can have several advantages including good workability, high thermal conductivity, and relatively low cost.

Openings 44 are provided in the lead frame 41 along the position of interest to be cut so as to facilitate cutting of the lead frame 41 to be described later. The lead frame 41 can be manufactured by processing a copper alloy plate in a predetermined shape, for example, by molding (a press process), etching, or the like. The plating layers 14 are formed over the chip mounting portion 2 and lead portions 4 and 5 of the lead frame 41 by electrolytic plating or the like. The illustration of the plating layer 14 will be omitted below in the lead frame 41.

The semiconductor chip 3 can be prepared by forming a semiconductor element required in a semiconductor wafer (semiconductor substrate) (here, the longitudinal power MISFET with the trench gate structure or the like) and separating the semiconductor wafer into respective semiconductor chips by dicing or the like. The specific structure of the semiconductor chip 3 has been described above, and its description will be omitted below.

In step S1, the lead frame 41 is first prepared, and then the semiconductor chip 3 is prepared. Alternatively, the semiconductor chip 3 may be first prepared, and then the lead frame 41 may be prepared. Otherwise the lead frame 41 and the semiconductor chip 3 may be prepared at the same time.

Figure 16:
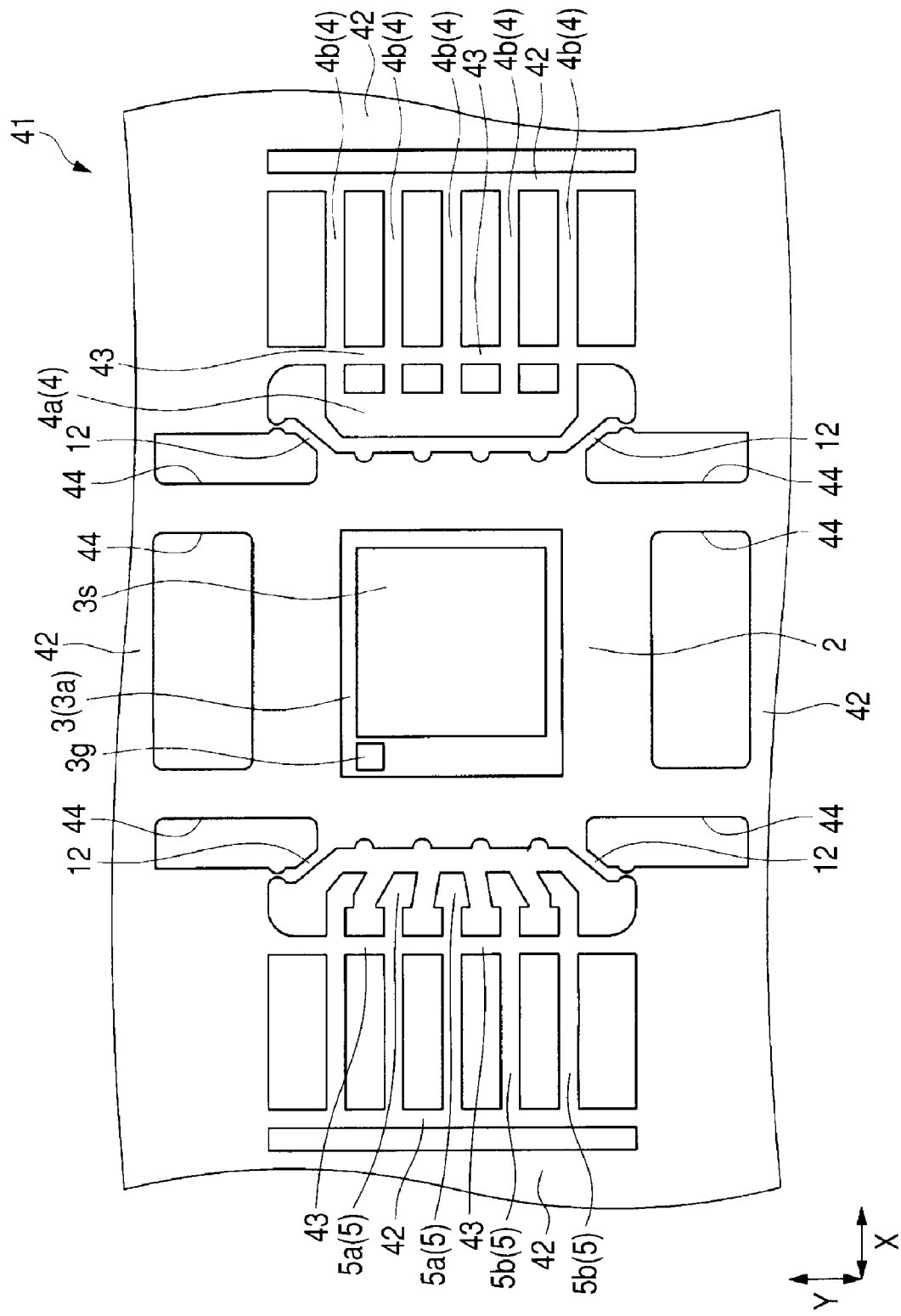
FIG. 16 is a plan view of the semiconductor device during the manufacturing procedure in the embodiment of the invention.
Figure 17:
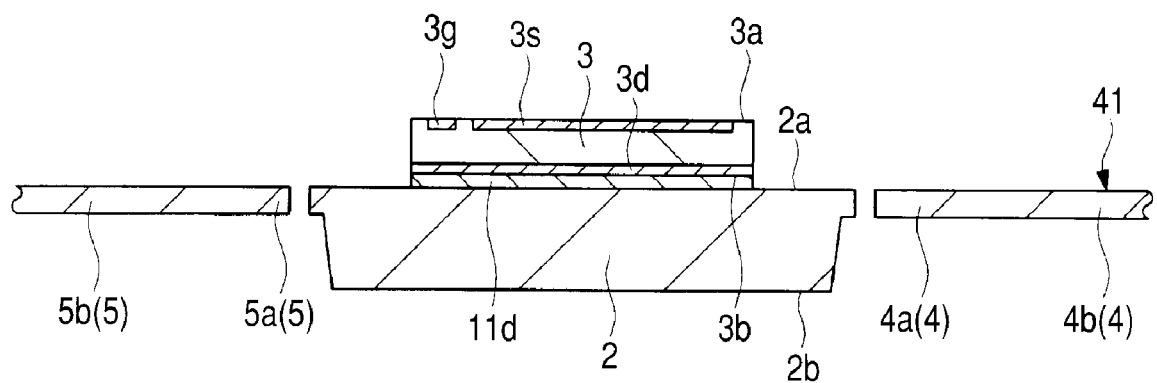
FIG. 17 is a cross-sectional view of the same semiconductor device as that shown in FIG. 16 during the manufacturing procedure.

After preparing the lead frame 41 and the semiconductor chip 3 in step S1, the semiconductor chip 3 is die-bonded to the chip mounting portion 2 of the lead frame 41 (in step S2 shown in FIG. 13). FIGS. 16 and 17 are a plan view (see FIG. 16) and a cross-sectional view (see FIG. 17) on the stage where the die bonding step in step S2 is performed. FIGS. 16 and 17 are the plan view and cross-sectional view corresponding to FIGS. 14 and 15, respectively.

In the die bonding process at step S2, the semiconductor chip 3 is mounted over the upper surface 2a of the chip mounting portion 2 of the lead frame 41 via a bonding material (here, the solder 11d) such that the back surface 3b of the semiconductor chip 3 is opposed to the chip mounting portion 2 (upper surface 2a) of the lead frame 41.

Specifically, a solder wire (wire-like solder) or the like is arranged (applied, or supplied) on the upper surface 2a of the chip mounting portion 2 (more specifically, onto the plating layer 14 provided at the upper surface 2a of the chip mounting portion 2), and then the semiconductor chip 3 is mounted (arranged) over the upper surface 2a (on the plating layer 14) of the chip mounting portion 2 via the solder wire. The semiconductor chip 3 is mounted over the upper surface 2a of the chip mounting portion 2 via the solder wire with the front surface 3a directed upward and with the back surface 3b opposed to the chip mounting portion 2 (upper surface 2a thereof). At this time, the semiconductor chip 3 is pushed against the upper surface 2a of the chip mounting portion 2 with the solder wire arranged therein, while heating the semiconductor chip 3 to, for example, about 340 to 410° C. The solder wire is melted and then solidified (solidified again) to form the solder (solder layer, third solder) 11d, which bonds the semiconductor chip 3 to the upper surface 2a of the chip mounting portion 2. In other embodiments, a solder paste can be used instead of the above-mentioned solder wire. The solder 11d can contain, for example, Pb—Sn—Ag—Cu based solder as a main material.

Figure 18:
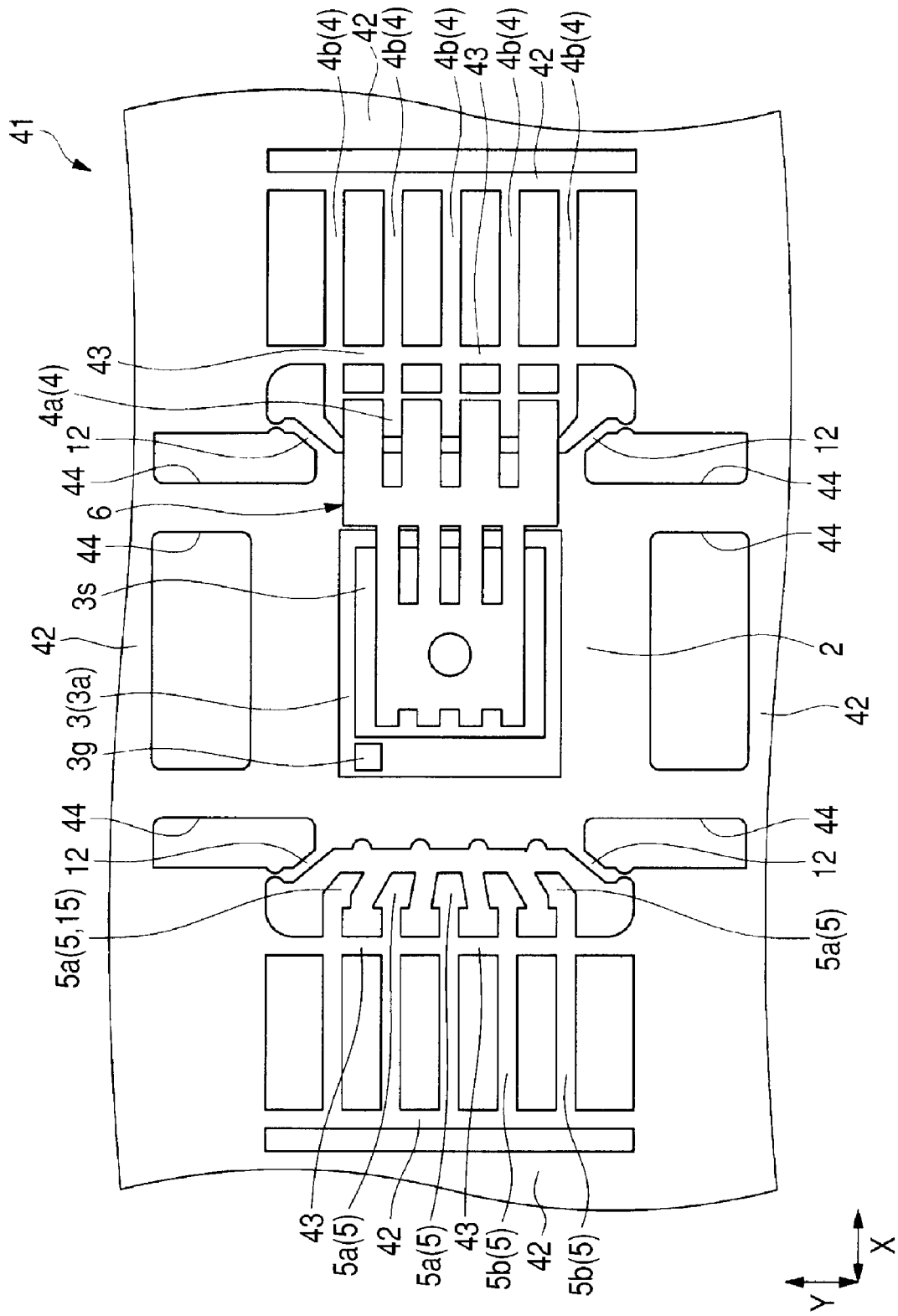
FIG. 18 is a plan view of the semiconductor device in a step following the step shown in FIG. 16 during the manufacturing procedure.
Figure 19:
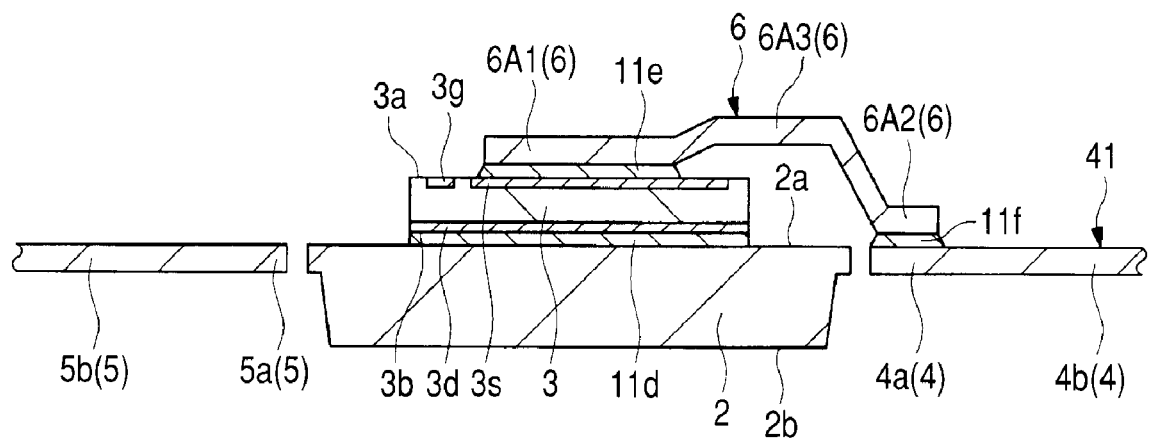
FIG. 19 is a cross-sectional view of the same semiconductor device as that shown in FIG. 18 during the manufacturing procedure.

After the die bonding process in step S2, the metal plate 6 is mounted (arranged) over the semiconductor chip 3 and the inner lead portion 4a of the lead portion 4, crossing both of them, via solder pastes (solders) 11e and 11f (in step S3 shown in FIG. 13). That is, the metal plate 6 is arranged over the source pad electrode 3s of the semiconductor chip 3 via the solder paste (first solder) 11e, and over the inner lead portion 4a of the lead portion 4 via the solder paste (second solder) 11f. FIGS. 18 and 19 are a plan view (see FIG. 18) and a cross-sectional view (see FIG. 19) on the stage where the mounting process of the metal plate 6 in step S3 is performed. FIGS. 18 and 19 are the plan view and cross-sectional view corresponding to FIGS. 14 and 15, respectively.

In the mounting process of the metal plate 6 at step S3, the solder paste 11e is arranged (applied, or supplied) onto the source pad electrode 3s of the semiconductor chip 3, and the solder paste 11f is arranged (applied, or supplied) onto the upper surface (the above-mentioned plating layer 14 thereof) of the inner lead portion 4a of the lead portion 4. The solder paste 11e is first arranged. Alternatively, the solder paste 11f may be first arranged. Otherwise the solder paste 11e and the solder paste 11f may be arranged at the same time. The solder paste 11e and the solder paste 11f are more preferably formed of the same solder paste material, which can simplify the arrangement process of the solder pastes 11e and 11f. Then, the planar position of the metal plate 6 is aligned with that of the semiconductor chip 3, and the metal plate 6 is mounted (arranged) over the semiconductor chip 3 and the inner lead portion 4a of the lead portion 4 via the solder pastes 11e and 11f. The adhesion of the solder pastes 11e and 11f temporarily bonds (temporarily fixes) the metal plate 6 to the semiconductor chip 3 and the inner lead portion 4a of the lead portion 4.

After preparing the metal plate 6, the mounting process of the metal plate 6 is performed in step S3. Thus, the preparation of the metal plate 6 may be performed after step S2, at the same time as step S2, before step S2, after step S1, at the same time as step S1, or before step S1. The metal plate 6 can be prepared by preparing, for example, a frame (frame for the metal plate 6) comprised of a plurality of metal plates 6 integrally joined together, and separating each metal plate 6 therefrom. The frame for the metal frame 6 is formed of copper (preferably, oxygen-free copper), like the metal plate 6. The metal plate 6 is kept while being joined to the frame for the metal plate 6 until the solder pastes 11e and 11f are applied to the source pad electrode 3s and the inner lead portion 4a. After applying the solder pastes 11e and 11f, the metal plate 6 can be cut from the frame for the metal plate 6, and vacuumsucked to be transferred and positioned over the semiconductor chip 3 and the inner lead portion 4a via the solder pastes 11e and 11f.

Figure 20:
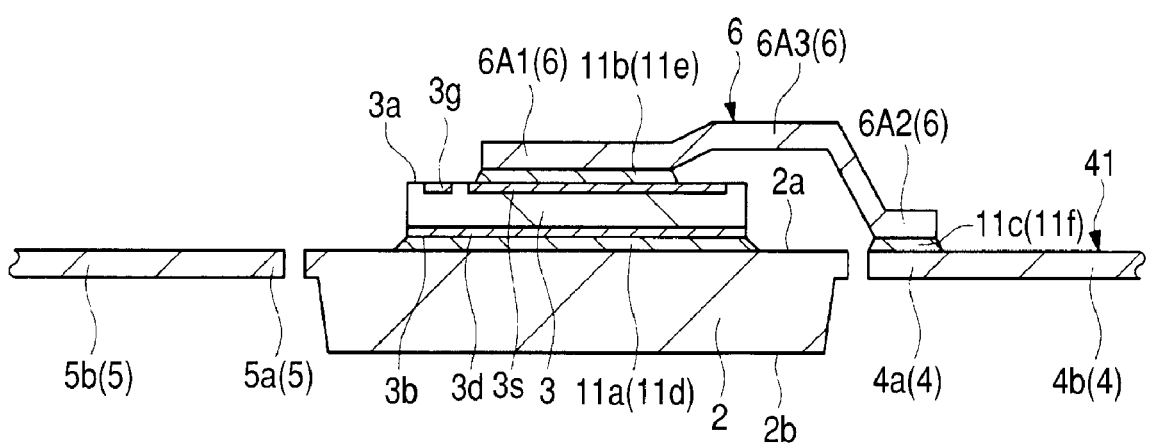
FIG. 20 is a cross-sectional view of the semiconductor device in a step following the step shown in FIG. 19 during the manufacturing procedure.

After the mounting process of the metal plate 6 in step S3, a solder reflow process (heat treatment) is performed as a heat treatment (in step S4 shown in FIG. 13). The solder reflow process in step S4 is a heat treatment for melting the solder pastes 11e and 11f. FIG. 20 is a cross-sectional view of the stage on which (directly after) the solder reflow process in step S4 is performed, and shows the cross-sectional view corresponding to the above-mentioned FIG. 15.

The solder pastes 11e and 11f are melted and solidified (solidified again) by the solder reflow process in step S4 to become the above-mentioned solders 11b and 11c. That is, the solder paste 11e arranged to intervene between the metal plate 6 and the source pad electrode 3s of the semiconductor chip 3 in the mounting process of the metal plate 6 at step S3 is melted and solidified (solidified again) by the solder reflow process (heat treatment) in step S4 to become the above-mentioned solder 11b. The solder paste 11f arranged to intervene between the metal plate 6 and the inner lead portion 4a of the lead portion 4 in the mounting process of the metal plate 6 at step S3 is melted and solidified (solidified again) by the solder reflow process in step S4 to become the above-mentioned solder 11c. The solder 11d intervening between the semiconductor chip 3 and the chip mounting portion 2 is melted (melted again) and solidified (solidified again) by the solder reflow process in step S4 to become the above-mentioned solder 11a.

Thus, the solder reflow process (heat treatment) in step S4 causes the metal plate 4 to be bonded to the source pad electrode 3s of the semiconductor chip 3 via the solder 11b (that is, the solder paste 11e melted and then solidified), whereby the metal plate 6 is bonded to the inner lead portion 4a of the lead portion 4 via the solder 11c (that is, the solder paste 11f melted and then solidified). Further, the back-surface drain electrode 3d of the semiconductor chip 3 is bonded to the chip mounting portion 2 via the solder 11a (that is, the solder 11d melted and then solidified). The back surface (lower surface) of the first part 6A1 of the metal plate 6 is bonded (adheres) to the source pad electrode 3s of the front surface 3a of the semiconductor chip 3 via the solder 11b. The back surface (lower surface) of the second part 6A2 of the metal plate 6 is bonded (adheres) to the inner lead portion 4a of the lead portion 4 via the solder 11c.

Even when the bonding force between the semiconductor chip 3 and the chip mounting portion 2 by the solder 11d is not sufficient yet on the stage of the die bonding process in step S2, the solder reflow process in step S4 causes the solder 11d to be melted again and solidified again. Thus, the solder 11d (that is, the solder 11a) penetrates and expands through and over the back surface 3b of the semiconductor chip 3, which improves the bonding force between the semiconductor chip 3 and the chip mounting portion 2 by the solder 11a. Thus, the semiconductor chip 3 can be securely fixed to the chip mounting portion 2.

Thus, the solder reflow process should be performed in step S4 at a temperature equal to or more than a melting point of at least the solder paste 11e or 11f (solder forming the paste). The solder reflow process may be preferably performed at the temperature equal to or more than the melting point of each of the solder pastes 11e and 11f (solder forming the pastes), and equal to or more than the melting point of the solder 11d. Thus, not only the solder pastes 11e and 11f, but also the solder 11d can be melted by the solder reflow process in step S4. The melting point of the solder paste 11e (solder forming the paste) is the same as that of the solder 11b. The melting point of the solder paste 11f (solder forming the paste) is the same as that of the solder 11c. The melting point of the solder 11d is the same as that of the solder 11a.

The solder pastes 11e and 11d (solder 11b and 11c) can contain, for example, Pb—Sn based solder as a main material. The melting point of the solder forming the solder pastes 11e and 11f (solder 11b and 11c) can be, for example, about 320° C. The temperature of the solder reflow in step S4 can be, for example, about 340 to 380° C.

By the solder reflow process in step S4, the semiconductor chip 3 can be securely fixed (bonded) to the chip mounting portion 2, while the metal plate 6 can be fixed (bonded) to the semiconductor chip 3 and the inner lead portion 4a of the lead portion 4.

After the solder reflow process in step S4, a cleaning process is performed (in step S5 shown in FIG. 13). The cleaning process in step S5 can remove flux generated in the solder reflow process at step S4 by immersion in, for example, an alcohol solution or the like. Further, the gate pad electrode 3g of the semiconductor chip 3 and the metal surface of the plating layer 14 in the lead portion 5 are exposed by the plasma cleaning process, which can facilitate wire bonding.

Figure 21:
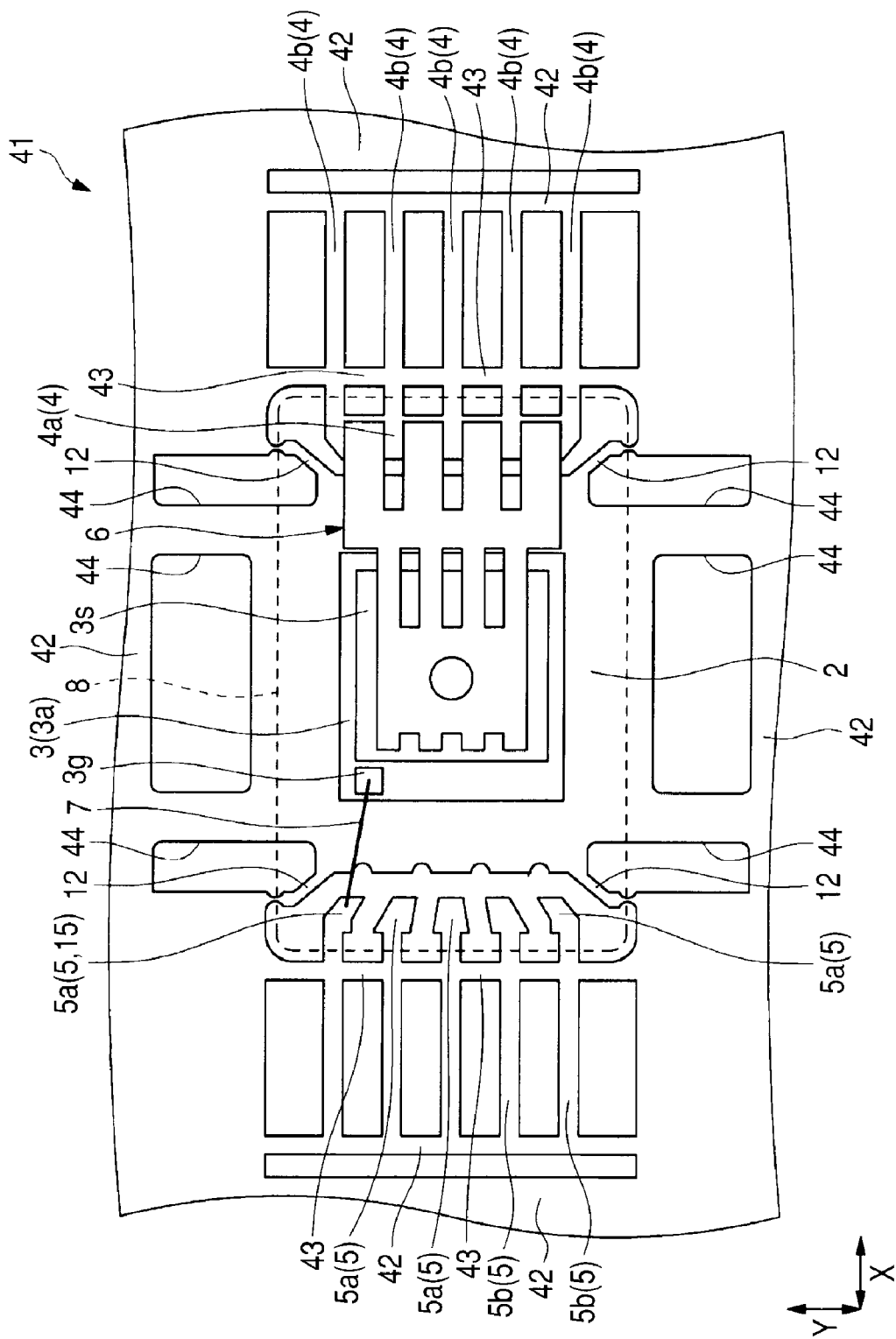
FIG. 21 is a plan view of the semiconductor device in a step following the step shown in FIG. 20 during the manufacturing procedure.
Figure 22:
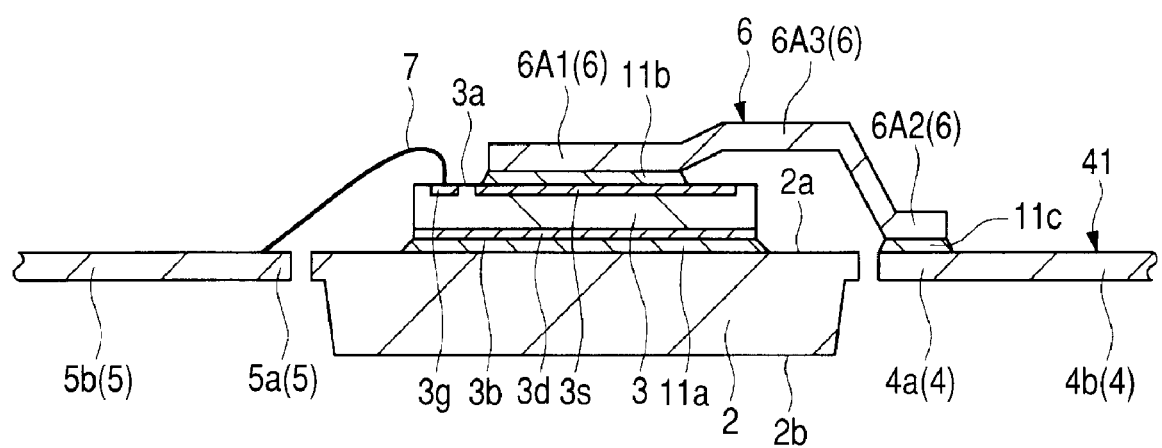
FIG. 22 is a cross-sectional view of the same semiconductor device as that shown in FIG. 21 during the manufacturing procedure.

After the cleaning process in step S5, the wire bonding process is performed (in step S6 shown in FIG. 13). FIGS. 21 and 22 are a plan view (see FIG. 21) and a cross-sectional view (see FIG. 22) of the stage where the wire bonding step is performed in step S6. FIGS. 21 and 22 are the plan view and cross-sectional view corresponding to FIGS. 14 and 15, respectively. In FIG. 21, the outer appearance position of the sealing resin portion 8 formed in a molding process at step S7 to be described later is indicated by a dotted line, and an area enclosed by the dotted line is sealed with the sealing resin portion 8.

In the wire bonding process at step S6, the wire 7 establishes electrical coupling between the gate pad electrode 3g of the semiconductor chip 3 and the inner lead portion 5a of the lead portion 5 (lead portion 5 corresponding to the lead portion 15).

The wire bonding process in step S6 needs to be performed at least after the die bonding process in step S2 and before the molding process in step S7 to be described later. As described above, the wire bonding process is preferably performed in step S6 preferably after steps S3, S4, and S5. If the processes in steps S3, S4, and S5 are performed after the wire bonding process in step S6, the metal plate 6 may be in contact with the wire 7 in mounting the metal plate 6 in step S3 to deform the wire 7. In the cleaning process at step S5 after the solder bonding of the metal plate 6, stress can be applied to the wire 7. In contrast, like this embodiment, the wire 7 is coupled in step S6 after solder-bonding the metal plate 6 (after the cleaning process in step S5) in steps S3 and S4, whereby the failures of deformation of the wire 7 due to the contact with the metal plate 6 can be prevented. In the cleaning process in step S5 after the solder bonding of the metal plate 6, the wire 7 is not formed yet, so that no stress is applied to the wire 7 in the cleaning process. Thus, the reliability and yield of the semiconductor device 1 can be enhanced.

Figure 23:
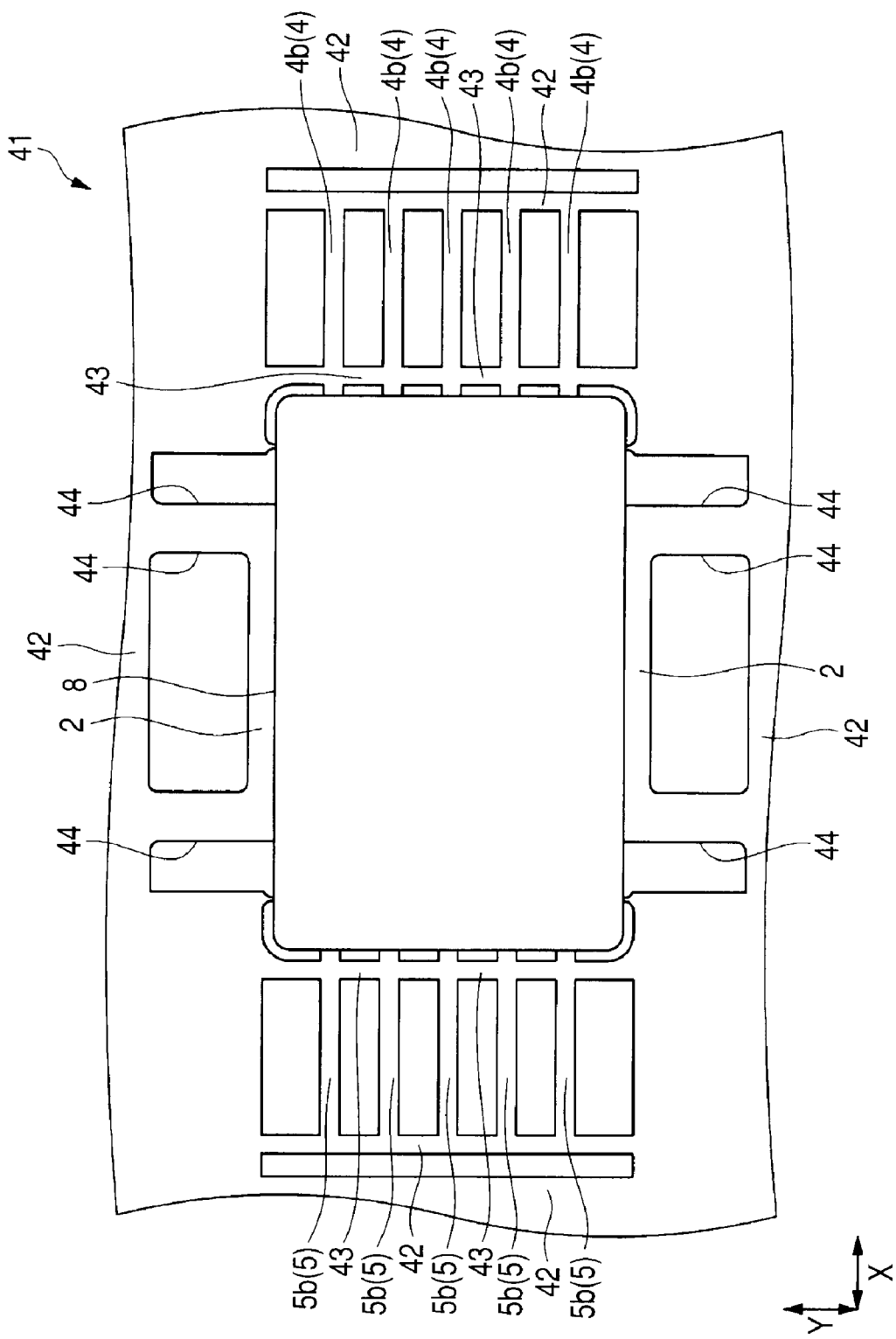
FIG. 23 is a plan view of the semiconductor device in a step following the step shown in FIG. 21 during the manufacturing procedure.
Figure 24:
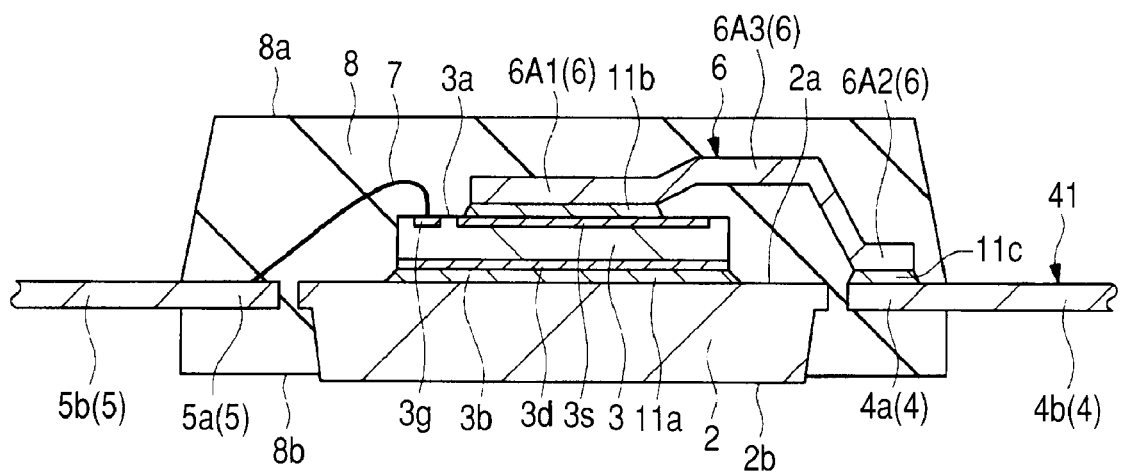
FIG. 24 is a cross-sectional view of the same semiconductor device as that shown in FIG. 23 during the manufacturing procedure.

After the wire bonding process in step S6, the sealing resin portion 8 is formed in the molding process (resin sealing process, for example, a transfer molding process), so that the semiconductor chip 3, the metal plate 6, and the wire 7 are sealed with the sealing resin portion 8 (in step S7 shown in FIG. 13). FIGS. 23 and 24 are a plan view (see FIG. 23) and a cross-sectional view (see FIG. 24) of the stage where the molding process is performed in step S7. FIGS. 23 and 24 are the plan view and cross-sectional view corresponding to FIGS. 14 and 15, respectively. The structure of the sealing resin portion 8 has been described above, and thus its description thereof will be omitted below.

After the molding process in step S7, a plating layer (not shown), such as a solder plating layer, is formed on the surface of the lead frame 41 (including the chip mounting portion 2 and the lead portions 4 and 5) exposed from the sealing resin portion 8 (in step S8 shown in FIG. 13).

Figure 25:
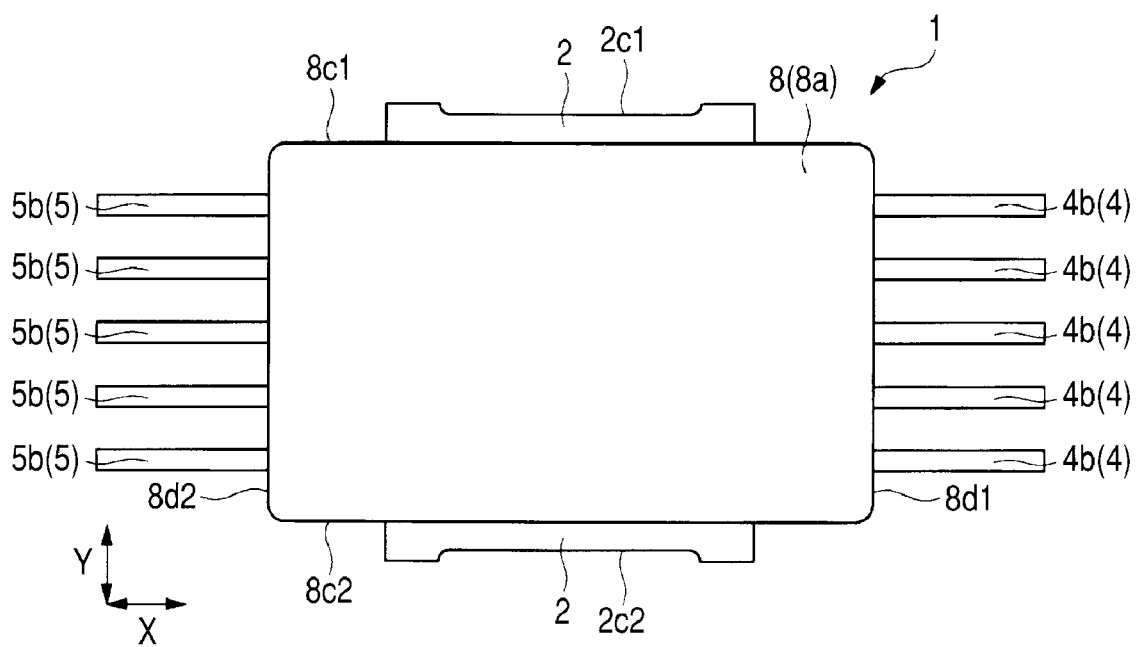
FIG. 25 is a plan view of the semiconductor device in a step following the step shown in FIG. 23 during the manufacturing procedure.
Figure 26:
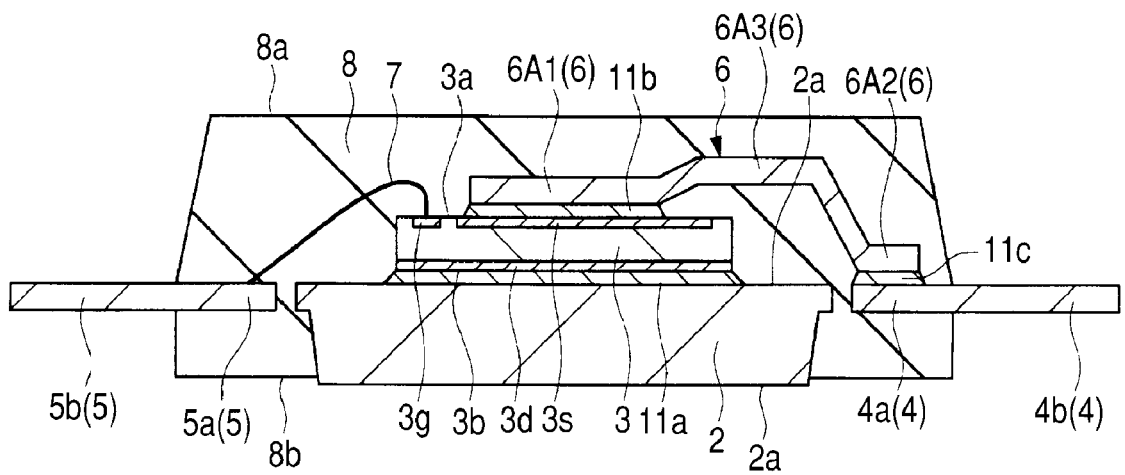
FIG. 26 is a cross-sectional view of the same semiconductor device as that shown in FIG. 25 during the manufacturing procedure.

After the plating process in step S8, the lead frame 41 is cut outside the sealing resin portion 8 (in step S9 shown in FIG. 13). That is, a part of the lead frame 41 outside the sealing resin portion 8 is cut. FIGS. 25 and 26 are a plan view (see FIG. 25) and a cross-sectional view (see FIG. 26) of the stage where the cutting process is performed in step S9. FIGS. 25 and 26 are the plan view and cross-sectional view corresponding to FIGS. 14 and 15, respectively.

In the cutting process at step S9, the tie bars 43 of the lead frame 41 are cut, and then the lead portions 4 and 5 are cut in predetermined positions such that the outer lead portions 4*b* and 5*b* in a predetermined length remain on the semiconductor device 1 side. By the cutting process in step S9, the lead portions 4 and 5 are isolated from the lead frame 41 (frame 42 thereof), so that the outer lead portions 4*b* and 5*b* of the lead portions 4 and 5 are protruded from the sides of the sealing resin portion 8.

In the cutting process at step S9, not only the lead portions 4 and 5, but also the suspended lead portions 12 protruding from the sealing resin portion 8 are cut. When cutting the suspended lead portion 12 in the cutting process at step S9, the suspended lead portion 12 obtained after the cutting process is controlled so as not to protrude from the side of the sealing resin portion 8. Thus, the cut section of the suspended lead portion 12 is exposed at the side of the sealing resin portion 8. In the cutting process at step S9, a part of the chip mounting portion 2 protruding from one side of the sealing resin portion 8 is also cut. Thus, the chip mounting portion 2 sealed with the sealing resin portion 8 is isolated from the lead frame 41 (frame 42 thereof). The chip mounting portion 2 can be cut in a position where the chip mounting portion 2 slightly protrudes from the other side of the sealing resin portion 8. FIG. 25 corresponds to this case.

After the cutting process in step S9, the outer lead portions 4*b* and 5*b* of the lead portions 4 and 5 protruding from the sealing resin 8 are bent and processed (subjected to a lead process) (in step S10 shown in FIG. 13). Thus, a piece of semiconductor device (semiconductor package) 1 of this embodiment is obtained (manufactured) as described above with reference to FIGS. 1 to 7.

Figure 27:
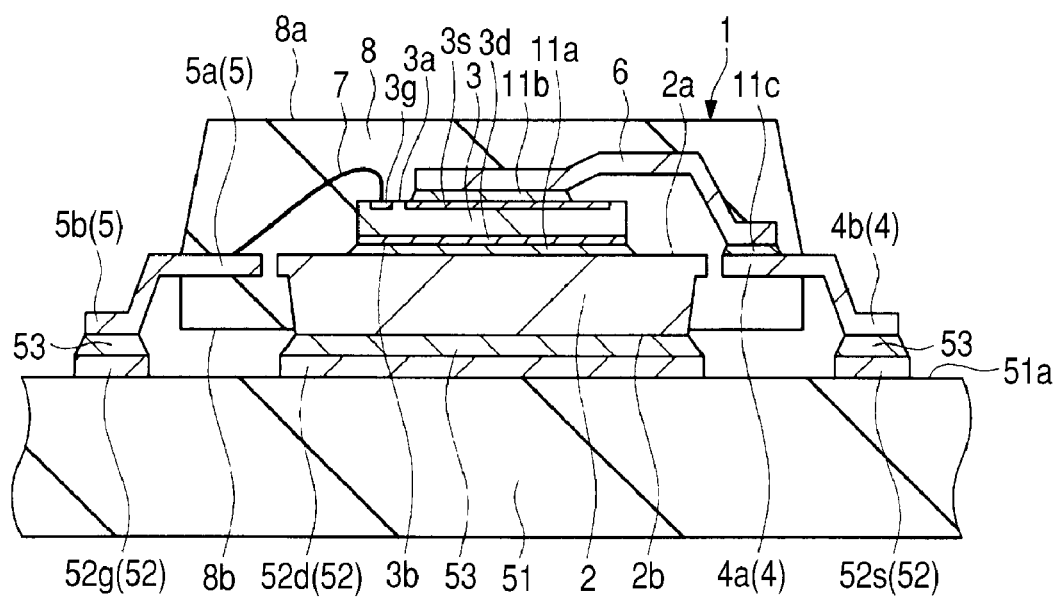
FIG. 27 is a cross-sectional view showing a state of mounting the semiconductor device over a mounting board in the embodiment of the invention.

FIG. 27 is a cross-sectional view (side cross-sectional view) showing a state of mounting the semiconductor device 1 of this embodiment at a mounting board (wiring board) 51, showing the section corresponding to FIG. 3.

The mounting board 51 for mounting the semiconductor device 1 thereon as shown in FIG. 27 is a wiring board (for example, multilayer wiring board), and has a plurality of substrate side terminals (terminals) 52 formed on an upper surface 51*a*, which is a mounting surface for mounting thereon the semiconductor device 1. The substrate side terminal 52 is formed by a conductive pattern, and includes a substrate side terminal 52*s* for coupling to the lead portion 4 (outer lead portion 4*b* thereof), a substrate side terminal 52*g* for coupling to the lead portion 5 (outer lead portion 5*b* thereof), and a substrate side terminal 52*d* for coupling to the lower surface 2*b* of the chip mounting portion 2 exposed from the back surface 8*b* of the sealing resin portion 8.

In mounting the semiconductor device 1 over the mounting board 51, solder paste is supplied to the substrate side terminals 52 of the mounting board 51 by a printing process or the like, and then the semiconductor device 1 is mounted (arranged) on the mounting board 51. Thereafter, a solder reflow process is performed as a heat treatment. Thus, as shown in FIG. 27, the semiconductor device 1 is mounted (solder-mounted) over the mounting board 51, and fixed to the mounting board 51. And, the outer lead portions 4*b* and 5*b* (lower surfaces thereof) of the lead portions 4 and 5, and the lower surface 2*b* of the chip mounting portion 2 exposed at the back surface 8*b* of the sealing resin portion 8 are coupled (bonded) to the substrate side terminals 52 on the mounting board 51 via solder 53, respectively. At this time, the outer lead portion 4*b* (lower surface thereof) of the lead portion 4 is bonded (solder-bonded) and electrically coupled to the substrate side terminal 52*s* on the mounting board 51 via the solder 53. The outer lead portion 5*b* (lower surface thereof) of the lead portion 5 is bonded (solder-bonded) and electrically coupled to the substrate side terminal 52*g* on the mounting board 51 via the solder 53. The lower surface 2*b* of the chip mounting portion 2 is bonded (solder-bonded) and electrically coupled to the terminal 52*d* on the mounting board 51 via the solder 53.

Thus, the source pad electrode 3*s* of the semiconductor chip 3 in the semiconductor device 1 can be electrically coupled to the substrate side terminal 52*s* on the mounting board 51 via the solder 11*b*, the metal plate 6, the solder 11*c*, the lead portion 4, and the solder 53. The gate pad electrode 3*g* of the semiconductor chip 3 in the semiconductor device 1 can be electrically coupled to the substrate side terminal 52*g* on the mounting board 51 via the wire 7, the lead portion 5, and the solder 53. The back-surface drain electrode 3*d* of the semiconductor chip 3 in the semiconductor device 1 can be electrically coupled to the substrate side terminal 52*d* on the mounting board 51 via the solder 11*a*, the chip mounting portion 2, and the solder 53. Heat generated at the semiconductor chip 3 in the semiconductor device 1 can be radiated toward the mounting board 51 via the solder 11*a*, the chip mounting portion 2, the solder 53, and the substrate side terminal 52*d*. The heat can also be radiated toward the mounting board 51 via the solder 11*b*, the metal plate 6, the solder 11*c*, the lead portion 4, the solder 53, and the substrate side terminal 52*s*. Thus, the semiconductor device 1 can have improved heat radiation property. An electronic part other than the semiconductor device 1 can be mounted, if necessary, at an area except for the mounting area of the semiconductor device 1 at the upper surface 51*a* of the mounting board 51.

In the solder reflow process for mounting the semiconductor device 1 over the mounting board 51, the solder 53 for mounting is melted, but the solders 11*a*, 11*b*, and 11*c* inside the semiconductor device 1 are not melted, which is preferable for improving the reliability of the semiconductor device 1. Thus, the melting point of each of the solders 11*a*, 11*b*, and 11*c* inside the semiconductor device 1 is preferably higher than that of the solder 53 for mounting the semiconductor device 1, and higher than the temperature of the solder reflow process (reflow temperature, or heat treatment temperature) in mounting the semiconductor device 1 over the mounting board 51 or the like. Thus, solder having a higher melting point can be preferably used for the solders 11*a*, 11*b*, and 11*c* inside the semiconductor device 1. For example, the melting point of each of the solders 11*a*, 11*b*, and 11*c* is preferably equal to or more than 300° C.

Now, the features and effects of the semiconductor device 1 and the manufacturing procedure thereof according to this embodiment will be more specifically described below.

The metal plate can be used as a conductive material for electrically coupling the electrode pad on the front surface of the semiconductor chip (source pad electrode 3s in this embodiment) to the lead terminal (lead portion 4 in this embodiment) thereby to reduce the conduction loss and to improve the electrical property of the semiconductor device as compared to the use of the bonding wire. Solder may be preferably used for bonding the electrode pad of the semiconductor chip (source pad electrode 3a in this embodiment) and the lead terminal (lead portion 4 in this embodiment) to the metal plate so as to improve the electrical conductivity and bonding strength.

Studies by the inventors, however, have shown that after solder-bonding the metal plate to the electrode pad of the semiconductor chip and the lead terminal, the mechanical and thermal stresses may be generated in the metal plate, causing peeling of the solder bonded portion between the metal plate, and the electrode pad of the semiconductor chip and the lead terminal. Even when a peeled part of the solder bonded portion of the metal plate is small at the timing of appearance, a peeled area may be enlarged from the peeled part as a starting point in conducting a loading test, such as a high-temperature and high-humidity loading test, on a semiconductor device finished. Thus, in order to improve the reliability of the semiconductor device, the peeling of the solder bonded portion of the metal plate needs to be prevented as much as possible.

The inventors have found, by examining the relationship between the easiness of peeling of the solder bonded portion of the metal plate and the hardness (Vickers hardness) of the metal plate, that the solder bonded portion of the metal plate 6 having a high hardness tends to be easily peeled off, while the metal plate 6 having a low hardness tends to be deformed thereby to prevent the peeling of the solder bonded portion of the metal plate 6. This is because, when the metal plate 6 having the low hardness tends to be easily deformed to generate the mechanical and thermal stresses in the metal plate 6 during an assembly process of the semiconductor device, even the generated stresses can be absorbed by deformation of the metal plate 6. Thus, the stress applied to the solder bonded portion of the plate 6 can be decreased, which prevents the peeling of the solder bonded portion of the metal plate 6.

In this embodiment, the hardness of the metal plate 6 is decreased, which prevents the peeling of the solder bonded portion of the metal plate 6.

On the other hand, the lead frame 41 having a low hardness tends to be easily deformed. The deformation of the lead frame 41 makes it difficult to deliver the lead frame 41 during assembly of the semiconductor device 1, which can lead to a failure of the delivery. Thus, the semiconductor 1 is hard to manufacture (that is, the assembly workability of the semiconductor device 1 may be degraded).

In this embodiment, the hardness of the lead frame 41 including the chip mounting portion 2 and the lead portions 4 and 5 is increased, which prevents the deformation of the lead frame 41, thus improving the easiness of manufacturing the semiconductor device 1 (assembly workability of the semiconductor device 1).

That is, in this embodiment, the metal plate 6, and the chip mounting portion 2 and the lead portions 4 and 5 do not have the same hardness, but the hardness (Vickers hardness) of the metal plate 6 is set lower than the hardness (Vickers hardness) of the lead frame 41 including the chip mounting portion 2 and the lead portions 4 and 5. Thus, both the reliability of the semiconductor device 1 and the easiness of the manufacture (assembly workability) of the semiconductor device 1 can be improved by prevention of peeling of the solder bonded portion of the metal plate 6.

The use of only a metal plate having a low hardness as the metal plate 6 makes it difficult to handle the metal plate 6 in a semiconductor manufacturing device. For example, the metal plate 6 can be prepared by separating a number of coupled metal plates from a frame. When the metal plate 6 has a low hardness, the frame tends to be easily deformed, and thus is difficult to transfer. In the mounting process of the metal plate 6 at step S3 as described above, the metal plate 6 needs to be mounted over the semiconductor chip 3 and the inner lead portion 4a, while preventing deformation of the metal plate 6. The metal plate 6 having a low hardness is easily deformed mechanically, which makes it difficult to perform the mounting process of the metal plate 6 in the above step S3. Thus, in the mounting process of the metal plate 6 at the above step S3, the hardness of the metal plate 6 is desired to be high. In this embodiment, the material or properties of the metal plate 6, and the manufacturing process of the semiconductor device 1 are devised in the following way, thereby solving the described problem.

The lead frame 41 and the metal plate 6 formed of copper (Cu) or a copper (Cu) alloy have advantages including good workability, high thermal conductivity, and relatively low cost. The copper (Cu) material has a feature that the thermal conductivity is decreased, but the heat resistance and the corrosion resistance are improved when impurities are added to the copper material. The copper (Cu) or copper (Cu) alloy has a feature that upon being heated, the hardness (Vickers harness) thereof is decreased.

Figure 28:
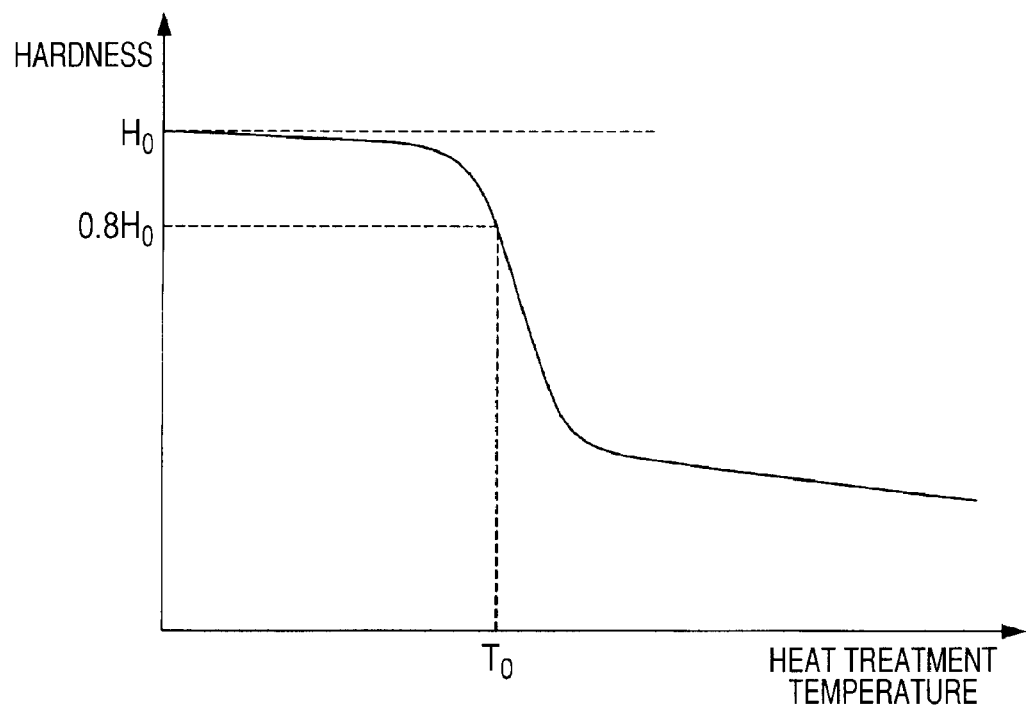
FIG. 28 is a graph showing the relationship between the heat treatment temperature and the hardness in applying a heat treatment to copper or a copper alloy.

FIG. 28 is a graph showing the relationship between the heat treatment temperature and the hardness in applying the heat treatment to copper (Cu) or a copper (Cu) alloy. The transverse axis in the graph of FIG. 28 corresponds to the heat treatment temperature of the copper (Cu) or copper (Cu) alloy, and the longitudinal axis in the graph of FIG. 28 corresponds to the hardness (Vickers hardness) of the copper (Cu) or copper (Cu) alloy subjected to the heat treatment. The values on both axes are respectively represented in arbitrary units. $H_0$ of the graph in FIG. 28 is an initial hardness (initial Vickers hardness), which is a hardness obtained before the heat treatment.

As can be seen from the graph of FIG. 28, the copper (Cu) or copper (Cu) alloy tends to have its hardness decreased when subjected to the heat treatment, and especially has its hardness drastically decreased when subjected to the heat treatment at a temperature equal to or higher than one temperature range (that is, near a softening temperature $T_0$).

The hardness (Vickers hardness) of the copper material at the room temperature obtained before the heat treatment, namely, the initial hardness $H_0$ is defined as a reference. The temperature of the heat treatment performed (heat treatment temperature) when the hardness (Vickers hardness) at room temperature after the heat treatment is 80% (that is, $0.8 H_0$) of the initial hardness $H_0$ is defined as a softening temperature (softening point) $T_0$. The heat treatment for calculating the softening temperature $T_0$ is performed in such a manner that a holding time at the heat treatment temperature is about 5 minutes.

Therefore, when the member comprised of copper (Cu) or a copper (Cu) alloy is subjected to a heat treatment at a softening temperature $T_0$ of the member, the member is softened, and has 80% of the initial hardness $H_0$ obtained before the heat treatment (that is, $0.8H_0$). When subjected to the heat treatment at a temperature higher than the softening temperature $T_0$, the hardness of the copper member becomes less than 80% of the initial hardness $H_0$ obtained before the heat treatment (that is, below $0.8 H_0$). Conversely, the member comprised of copper (Cu) or a copper (Cu) alloy has a hardness higher than 80% of the initial hardness $H_0$ (that is, 0.8 $H_0$) obtained before the heat treatment even when the member is subjected to the heat treatment at a temperature lower than the softening temperature $T_0$. The member softened by the heat treatment (heating) has a hardness which does not return to the initial hardness $H_0$, and remains softened even when cooled up to the room temperature after the heat treatment.

Figure 29:
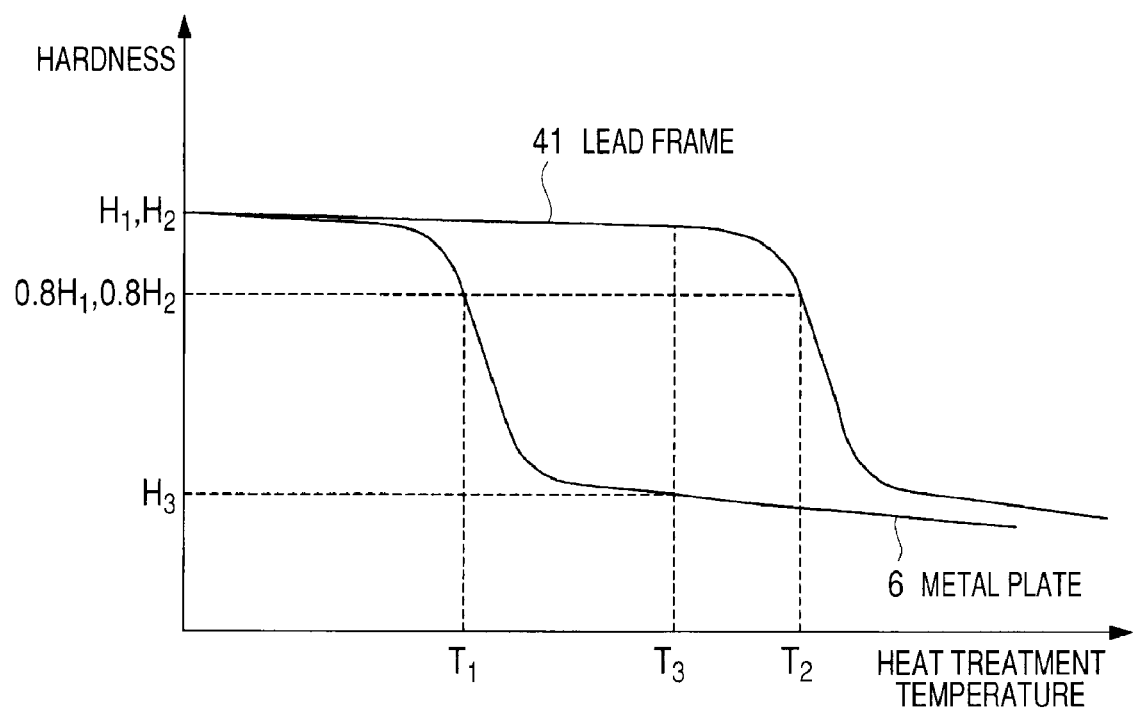
FIG. 29 is a graph showing the relationship between the heat treatment temperature and hardness of the metal plate and the lead frame used for manufacturing the semiconductor device in the embodiment of the invention.

In this embodiment, as shown in the graph of FIG. 29 to be described later, such properties of the copper (Cu) and copper (Cu) alloy are used, so that the softening temperature (softening point) $T_1$ of the metal plate 6 used in the mounting process of the metal plate 6 at step S3 is different from the softening temperature (softening point) $T_2$ of the lead frame 41 prepared in step S1. The softening temperature $T_1$ of the metal plate 6 used in the mounting process of the metal plate 6 at step S3 is set lower than the softening temperature $T_2$ of the lead frame 41 prepared in step S1 (that is, $T_1 < T_2$). The reason for making a difference in softening temperature between the metal plate 6 and the lead frame 41 is that the lead frame 41 is hardly softened, but the metal plate 6 can be softened during the assembly process (manufacturing procedure) of the semiconductor device 1 so as to make a difference in decreasing rate of the hardness between the metal plate 6 and the lead frame 41.

FIG. 29 is a graph showing the relationship between the heat treatment temperature and hardness of the metal plate 6 and the lead frame 41, and corresponds to the graph in FIG. 28 described above. The transverse axis in the graph of FIG. 29 corresponds to the heat treatment temperature, and the longitudinal axis in the graph of FIG. 29 corresponds to the hardness (Vickers hardness) of the metal plate 6 or the lead frame 41. The values on both axes are respectively represented in arbitrary units.

The $T_1$ represented in the graph of FIG. 29 is a softening temperature of the metal plate 6 to be used in the mounting process of the metal plate 6 at step S3. The $T_2$ is a softening temperature of the lead frame 41 prepared in step S1. The $T_3$ is a temperature of the solder reflow in step S4 (that is, a heat treatment temperature or heating temperature in step S4). The $H_1$ represented in the graph of FIG. 29 is an initial hardness of the metal plate 6 to be used in the mounting process of the metal plate 6 at step S3, and corresponds to the hardness of the metal plate 6 (hardness at room temperature) obtained directly before the mounting process in step S3. Since the metal plate 6 is hardly heated until the solder reflow process in step S4, the hardness of the metal plate 6 hardly changes directly before performing the solder reflow process in step S4, and the hardness of the metal plate 6 obtained directly before the solder reflow in step S4 substantially corresponds to the initial hardness $H_1$. The $H_2$ represented in the graph of FIG. 29 is an initial hardness of the lead frame 41 prepared in step S1, and corresponds to the hardness (hardness at room temperature) of the lead frame 41 on the stage where the frame is prepared in step S1, and also to the hardness of the lead frame 41 obtained directly before the die bonding process in step S2. The $H_3$ represented in the graph of FIG. 29 corresponds to the hardness of the metal plate 6 (hardness at room temperature) obtained after the solder reflow process in step S4.

The definition of the softening temperatures $T_1$ and $T_2$ is the same as that of the softening temperature $T_0$. Thus, as shown in FIG. 29, when the metal plate 6 to be used in the mounting process of the plate 6 at step S3 is subjected to the heat treatment, the softening temperature $T_1$ of the metal plate 6 to be used in the mounting process of the plate 6 at step S3 corresponds to the following temperature. That is, the temperature $T_1$ corresponds to a temperature of the heat treatment at which the hardness of the metal plate 6 can be reduced to 80% of the initial hardness $H_1$ obtained before the heat treatment (that is, 0.8 $H_1$). The softening temperature $T_2$ of the lead frame 41 prepared in step S1 corresponds to a temperature of the heat treatment at which the hardness of the lead frame 41 can be reduced to 80% of the initial hardness $H_2$ obtained before the heat treatment (that is, 0.8 $H_2$) when the lead frame 41 prepared in step S1 is subjected to the heat treatment.

Since the lead frame 41 is made of the copper alloy, when the lead frame 41 is heated to a temperature equal to or more than the softening temperature $T_2$ of the frame 41 during the assembly process of the semiconductor device 1, the lead frame 41 has its hardness reduced, and is then softened. When the lead frame 41 is softened during the manufacturing procedure of the semiconductor device 1, the failure of the delivery tends to occur due to the softening of the lead frame 41 during the processes following the softening step. That is, the softened lead frame 41 tends to be easily deformed. The deformation of the lead frame 41 makes it difficult to deliver the lead frame 41 during the assembly of the semiconductor device 1, which can lead to the failure of delivery. Thus, the lead frame 41 preferably maintains the initial hardness $H_2$ without being softened during the assembly process of the semiconductor device 1.

In this embodiment, the softening temperature $T_2$ of the lead frame 41 prepared in step S1 is set higher, whereby the lead frame 41 does not reach a temperature equal to or more than the softening temperature $T_2$ during the assembly process (steps S1 to S9) of the semiconductor device 1. In other words, the softening temperature $T_2$ of the lead frame 41 prepared in step S1 is set higher than the maximum temperature at which the lead frame 41 reaches during the assembly process of the semiconductor device 1. The times when the lead frame 41 is particularly at high temperature during the assembly process of the semiconductor device 1 are the time of the die bonding process in step S2, and the time of the solder reflow process in step S4. Thus, the softening temperature $T_2$ of the lead frame 41 prepared in step S1 is set higher than the heating temperature in the die bonding process in step S2 (the temperature which the lead frame 41 reaches in step S2), and the solder reflow temperature $T_3$ in step S4. The heating time of the lead frame 41 in the die bonding process at step S2 is relatively short, but the heating time of the lead frame 41 in the solder reflow process at step S4 is long, and thus the lead frame 41 tends to be easily softened in the solder reflow process at step S4. Accordingly, it is very important to set the softening temperature $T_2$ of the lead frame 41 prepared in step S1 higher than the solder reflow temperature $T_3$ in step S4. Thus, the lead frame 41 does not reach a temperature equal to or more than the softening temperature $T_2$ of the lead frame 41, in the die bonding process at step S2 and in the solder reflow process at step S4, which can prevent the lead frame 41 from being softened in the high-temperature processes (steps S2 and S4).

In this way, the lead frame 41 does not reach the temperature equal to or more than the softening temperature $T_2$ during the assembly process of the semiconductor device 1, which can prevent the lead frame 41 from being softened due to the heating in the assembly process (manufacturing procedure) of the semiconductor device 1. Thus, the lead frame 41 can substantially maintain the high initial hardness $H_2$ during the assembly process (manufacturing procedure) of the device 1. The lead frame 41 is hard to deform during the assembly process (manufacturing procedure) of the semiconductor device 1, which can prevent the failure of delivery.

In particular, as mentioned above, solder having a high melting point, for example, solder having a melting point of 300° C. or more, is used for the solders 11a, 11b, and 11c so as to prevent the solders 11a, 11b, and 11c in the semiconductor device 1 from being melted in the solder reflow process, while mounting the semiconductor device 1 over the mounting board 51. In this case, it is necessary to further set the heating temperature in the die bonding process at step S2 and the temperature $T_3$ in the solder reflow process at step S4 higher than the melting point of the high-melting point solder. Even when the heating temperature of the die bonding process in step S2 and the temperature $T_3$ in the solder reflow process at step S4 are high as mentioned above, the softening temperature $T_2$ of the lead frame 41 is set higher than the heating temperature in the die bonding process at step S2 (the temperature which the lead frame 41 reaches in step S2) and the temperature $T_3$ in the solder reflow process at step S4.

The chip mounting portion 2 and the lead portions 4 and 5 are parts of the lead frame 41, and integrally formed of the same copper alloy, whereby the softening temperature of the chip mounting portion 2 and the softening temperatures of the lead portions 4 and 5 are the same as the softening temperature $T_2$ of the lead frame 41.

After cutting the lead frame 41 in step S9, parts of the lead frame 41 other than the chip mounting portion 2 and the lead portions 4 and 5 are removed from the semiconductor device side, and the delivery using the lead frame 41 is not performed. As a result, even when the chip mounting portion 2 and the lead portions 4 and 5 are softened by being heated to a temperature higher than the softening temperature $T_2$, there is no adverse effect due to the softening. Thus, in order to obtain the effect for preventing the failure of delivery, the lead frame 41 may be controlled not to be at a temperature equal to or more than the softening temperature $T_2$ until the lead frame 41 is cut in step S9 after being prepared in step S1.

Since the softening temperature $T_2$ is higher than the temperature $T_3$ of the solder reflow in step S4, the softening temperature $T_2$ is logically higher than the melting point of each of the solders 11a, 11b, and 11c. Thus, if the chip mounting portion 2 and the lead portions 4 and 5 are at a temperature higher than the softening temperature $T_2$ after the cutting process of the lead frame 41 in step S9, the solders 11a, 11b, and 11c may be melted within the sealing resin portion 8. In order to enhance the reliability of the semiconductor device 1, the solders 11a, 11b, and 11c are preferably prevented from being melted within the sealing resin portion 8. Thus, also after cutting the lead frame 41 in step S9, the chip mounting portion 2 and the lead portions 4 and 5 are preferably controlled not to be at a temperature equal to or more than the softening temperature $T_2$. Therefore, until the manufacturing of the semiconductor device 1 is completed (during steps S1 to S10), more preferably, the chip mounting portion 2 and the lead portions 4 and 5 (lead frame 41) are not at a temperature not equal to or more than the softening temperature $T_2$. Also, in the semiconductor device 1 completed, the chip mounting portion 2 and the lead portions 4 and 5 can substantially maintain the high initial hardness $H_2$.

As mentioned above, the softening temperature $T_2$ is a temperature of the heat treatment at which the hardness of the lead frame 41 is reduced to 80% of the initial hardness $H_2$ (that is, 0.8 $H_2$). In this embodiment, the lead frame 41 is controlled not to be at a temperature equal to or more than the softening temperature $T_2$ during the assembly process of the semiconductor device 1 (in steps S1 to S9, preferably, in steps S1 to S10). This results in that until the lead frame 41 is cut in step S9, the hardness of the lead frame 41 is higher than 80% of the initial hardness $H_2$ (that is, 0.8 $H_2$), and that the hardness of each of the chip mounting portion 2 and the lead portions 4 and 5 in the completed semiconductor device 1 is higher than 80% of the initial hardness of $H_2$ (that is, 0.8 $H_2$).

However, in order to prevent the failure of delivery, the softening of the lead frame 41 is preferably suppressed as much as possible during the assembly process of the semiconductor device 1. Until the lead frame 41 is cut in step S9, the hardness of the lead frame 41 is preferably equal to or more than 90% of the initial hardness $H_2$ (that is, 0.9 $H_2$), and more preferably equal to or more than 95% of the initial hardness of $H_2$ (that is, 0.95 $H_2$). Further, the hardness of each of the chip mounting portion 2 and the lead portions 4 and 5 in the completed semiconductor device 1 is preferably higher than 90% of the initial hardness $H_2$ (that is, 0.9 $H_2$), and more preferably higher than 95% of the initial hardness of $H_2$ (that is, 0.95 $H_2$). Thus, the failure of delivery of the semiconductor device 1 during the assembly process thereof can be more securely prevented. This can be achieved by increasing a difference between the softening temperature $T_2$ of the lead frame 41 and the temperature $T_3$ of the solder reflow process in step S4 (that is, $T_2-T_3$) thereby suppressing the softening of the lead frame 41 as much as possible. Thus, the softening temperature $T_2$ of the lead frame 41 is preferably higher than the heat treatment temperature $T_3$ of the solder reflow process in step S4 by 50° C. or more (that is, $T_2 \geqq T_3+50°$ C.). The lead frame 41 is preferably controlled not to be at a temperature equal to or more than "the temperature which is lower than the softening temperature $T_2$ by 50° C. (that is, $T_2-50°$ C.)" during the assembly process of the semiconductor device 1 (during steps S1 to S9, more preferably, steps S1 to S10).

On the other hand, the metal plate 6, which has such a low hardness as to be easily deformed, suppresses the peeling of the solder bonded portion of the metal plate 6 as described above. When the metal plate 6 with the low hardness is previously prepared, and then is solder-bonded to the semiconductor chip 3, the solder bonded portion of the metal plate 6 can be prevented from being peeled off, but the metal plate 6 with the low hardness is difficult to handle in the semiconductor manufacturing device.

Therefore, the hardness of the metal plate 6 is preferably high until the mounting process of the metal plate 6 in step S3 is ended. After solder-bonding the metal plate 6 to the semiconductor chip 3 (source pad electrode 3s thereof) and the lead portion 4 (inner lead portion 4a thereof) by the solder reflow process in step S4, the hardness of the metal plate 6 becomes preferably low so as to prevent the peeling of the solder bonded portion.

In this embodiment, the softening temperature $T_1$ of the metal plate 6 to be used in the mounting process of the metal plate 6 in step S3 is not the same as the softening temperature $T_2$ of the lead frame 41 prepared in step S1. The softening temperature $T_1$ of the metal plate 6 to be used in the mounting process of the metal plate 6 in step S3 is lower than the softening temperature $T_2$ of the lead frame 41 prepared in step S1 (that is, $T_1<T_2$).

Specifically, in the solder reflow process at step S4, the metal plate 6 is (heated to) at a temperature higher than the softening temperature $T_1$ of the metal plate 6. That is, the softening temperature $T_1$ of the metal plate 6 to be used in the mounting process of the metal plate 6 at step S3 is lower than the heat treatment temperature (heating temperature, or reflow temperature) $T_3$ in the solder reflow process at step S4 to be performed later (that is, $T_1<T_3$). Thus, the metal plate 6 is heated to a temperature higher than the softening temperature $T_1$ by the heat treatment (heating) in the solder reflow process at step S4 described above, so that the hardness (Vickers hardness) of the metal plate 6 is decreased from the initial hardness $H_1$ to the hardness $H_3$ (that is, $H_3<H_1$). The metal plate 6 maintains the reduced hardness $H_3$ even when being cooled to the room temperature after the solder reflow process in step S4.

The hardness of the metal plate 6 is reduced after the solder reflow process at step S4 (from the initial hardness $H_1$ to the hardness $H_3$). The hardness of the metal plate 6 to be used in the mounting process of the metal plate 6 at step S3 can be made higher (corresponding to the initial hardness $H_1$). And, the hardness of the metal plate 6 after the solder bonding by the solder reflow process in step S4 can be reduced (to one corresponding to the hardness $H_3$). In the mounting process of the plate 6 at step S3, the metal plate 6 having the high hardness (corresponding to the initial hardness $H_1$) is used, and hence is easy to handle. Since the hardness of the metal plate 6 (corresponding to the hardness $H_3$) becomes low after the solder reflow process in step S4, the metal plate 6 tends to be easily deformed, and the mechanical and thermal stresses can be absorbed by the deformation of the metal plate 6, which prevents the peeling of the solder bonded portion of the metal plate 6. Accordingly, both the easiness of manufacturing of the semiconductor device 1 and the reliability of the semiconductor device 1 can be improved.

Therefore, in this embodiment, the solder reflow process (heat treatment) is performed in step S4 at the temperature higher than the softening temperature $T_1$ of the metal plate 6 and lower than the softening temperature $T_2$ of the lead frame 41. Thus, a rate $\alpha_1$ of decrease in hardness of the metal plate 6 by the solder reflow process in step S4 is larger than a rate $\alpha_2$ of decrease in hardness of the lead frame 41 by the solder reflow process in step S4 (that is, $\alpha_1>\alpha_2$).

The rate $\alpha_1$ of decrease in hardness of the metal plate 6 by the solder reflow process in step S4 is represented by the following equation: $\alpha_1=(H_4-H_3)/H_4$. The formula is multiplied by 100 to be expressed in percentage as follows: $\alpha_1=(H_4-H_3)/H_4\times100$ (in units of %). The term $H_4$ used in the above formula means the hardness of the metal plate 6 obtained before the solder reflow process in step S4 (hardness at room temperature), which hardly changes after the mounting process in step S3 before the heating treatment of the solder reflow process in step S4. As a result, the $H_4$ is substantially the same as the initial hardness $H_1$ ($H_4=H_1$). Thus, the following formula can be obtained: $\alpha_1=(H_1-H_3)/H_1\times100$ (in units of %). The term $H_3$ used herein means the hardness of the metal plate 6 obtained after the solder reflow process in step S4 as described above. The hardness of the metal plate 6 is decreased from $H_4$ to $H_3$ after the solder reflow process in step S4.

On the other hand, the rate $\alpha_2$ of decrease in hardness of the lead frame 41 by the solder reflow process in step S4 is represented by the following equation: $\alpha_2=(H_6-H_5)/H_6$. The formula is multiplied by 100 to be expressed in percentage as follows: $\alpha_2=(H_6-H_5)/H_6\times100$ (in units of %). The term $H_6$ used in the above formula means the hardness (hardness at room temperature) of the lead frame 41 obtained before the solder reflow process in step S4. The term $H_5$ used therein means the hardness (hardness at room temperature) of the lead frame 41 obtained after the solder reflow process in step S4. The hardness of the lead frame 41 is decreased from $H_6$ to $H_5$ after the solder reflow process in step S4.

The solder reflow process is performed in step S4 at a temperature lower than the softening temperature $T_2$ of the lead frame 41, resulting in $H_6 \geq H_5 > 0.8H_6$. The rate $\alpha_2$ of decrease in hardness of the lead frame 41 by the solder reflow process in step S4 is consequently less than 20% (that is, $0 \leq \alpha_2 < 20\%$). In order to prevent the failure of delivery, however, the lead frame 41 preferably maintains its hardness, while being prevented from being softened in the solder reflow process at step S4 as much as possible. Thus, the rate $\alpha_2$ of decrease in hardness of the lead frame 41 in the solder reflow process at step S4 is preferably small. In other words, the rate $\alpha_2$ of decrease in hardness of the lead frame 41 due to the solder reflow process in step S4 is preferably equal to or less than 10% (that is, $\alpha_2 \leq 10\%$), and more preferably equal to or less than 5% (that is, $\alpha_2 \leq 5\%$), which can more surely prevent the failure of delivery of the semiconductor device 1. Since the solder reflow process in step S4 is performed at a relatively high temperature (for example, of about 340 to 380° C.), the rate $\alpha_2$ of decrease in hardness of the lead frame 41 due to the solder reflow process in step S4 cannot be completely set to zero. If the rate $\alpha_2$ of decrease in hardness of the lead frame 41 by the solder reflow process in step S4 can be set to zero (that is, $\alpha_2=0$), this state is most preferable for the purpose of preventing the failure of delivery.

In this embodiment, since the semiconductor device 1 is manufactured while the lead frame 41 is hardly softened, the softening temperatures of the chip mounting portion 2 and the lead portions 4 and 5 in the semiconductor device 1 manufactured are substantially the same as the softening temperature $T_2$ of the lead frame 41. In the semiconductor device 1 manufactured, each of the softening temperatures of the chip mounting portion 2 and the lead portions 4 and 5 (which is substantially the same as the softening temperature $T_2$) is higher than the temperature $T_3$ of the solder reflow process in step S4, and consequently, higher than the melting point of each of the solders 11$a$, 11$b$, and 11$c$ in the semiconductor device 1.

The temperature $T_3$ of the solder reflow process in step S4 needs to be set to a temperature less than the softening temperature $T_2$ of the lead frame 41, and equal to or more than the melting point of each of the solders 11$a$, 11$b$, and 11$c$ (solder pastes 11$e$ and 11$f$ and solder 11$d$). A relatively large difference between the softening temperature $T_2$ of the lead frame 4 and the melting point of each of the solders 11$a$, 11$b$, and 11$c$ (solder pastes 11$e$ and 11$f$ and solder 11$d$) facilitates management of the solder reflow process in step S4. The softening temperature $T_2$ of the lead frame 41 is preferably higher than the melting point of each of the solders 11$a$, 11$b$, and 11$c$ (solder pastes 11$e$ and 11$f$ and solder 11$d$) by 50° C. or more, which facilitates management of the solder reflow process in step S4. In this case, in the semiconductor device 1 manufactured, the softening temperature of each of the chip mounting portion 2 and the lead portions 4 and 5 (which is substantially the same as the softening temperature $T_2$) is higher than the melting point of each of the solders 11$a$, 11$b$, and 11$c$ in the device 1 by 50° C. or more.

The softening temperature $T_2$ of the lead frame 41 prepared in step S1 is more preferably higher than the heat treatment temperature $T_3$ of the solder reflow process in step S4 by 50° C. or more (that is, $T_2 \geq T_3+50°$ C.). In this way, the difference between the softening temperature $T_2$ of the lead frame 41 and the temperature $T_3$ of the solder reflow process can be ensured thereby to sufficiently suppress the reduction in hardness of the lead frame 41 by the solder reflow process in step S4 (that is, which can sufficiently decrease the rate $\alpha_2$ of decrease in hardness). Even when the temperature of the solder reflow process in step S4 slightly deviates from a preset value, the decrease in hardness of the lead frame 41 due to the solder reflow process in step S4 can be surely prevented, which facilitates the process management.

In order to improve both the prevention of peeling of the solder bonded portion of the metal plate 6 and the easiness of manufacturing of the semiconductor device 1, the hardness of the metal plate 6 is preferably reduced drastically after the solder reflow process, that is, the rate $\alpha_1$ of decrease in hardness of the metal plate 6 due to the solder reflow process in step S4 is preferably large. Thus, the rate $\alpha_1$ of decrease in hardness of the metal plate 6 by the solder reflow process in step S4 is preferably larger than 20% (that is, $\alpha_1 > 20\%$). This can surely achieve both the improvement of the reliability of the semiconductor device 1 by prevention of peeling of the solder bonded portion of the metal plate 6, and the easiness of manufacturing of the semiconductor device 1. The rate $\alpha_1$ of decrease in hardness of the metal plate 6 of more than 20% (that is, $\alpha_1 > 20\%$) by the solder reflow process in step S4 corresponds to the fact that the hardness $H_3$ of the metal plate 6 after the solder reflow process in step S4 is less than 80% of the hardness $H_4$ of the metal plate 6 before the solder reflow process in step S4 (that is, $H_3 < 0.8 H_4 = 0.8 H_1$).

The hardness $H_3$ of the metal plate obtained after the solder reflow process in step S4 is preferably low so as to prevent peeling of the solder bonded portion of the metal plate 6. In contrast, the hardness of the lead frame 41 is preferably high after the solder reflow process in step S4 so as to prevent the failure of delivery. Thus, the hardness $H_3$ of the metal plate obtained after the solder reflow process in step S4 is preferably lower than the hardness $H_5$ of the lead frame 41 obtained after the solder reflow process in step S4 (that is, $H_3 < H_5$), and more preferably equal to or less than 80% of hardness $H_5$ of the lead frame 41 obtained after the solder reflow process in step S4 (that is, $H_3 \leq 0.8 H_5$). This can surely provide the prevention effect of peeling of the solder bonded portion of the metal plate 6 (that is, the improvement effect of the reliability of the semiconductor device 1), and the prevention effect of the failure of delivery.

In the processes after the solder reflow process in step S4, all the semiconductor element or wafer is not at a temperature higher than the heat treatment temperature $T_3$ of the solder reflow process in step S4. The lead frame 41 substantially maintains the hardness $H_5$ thereof after the solder reflow process in step S4 until the cutting process is performed in step S9. Further, the chip mounting portion 2 and the lead portions 4 and 5 substantially maintain the hardness $H_5$ of the lead frame 41 (chip mounting portion 2 and lead portions 4 and 5) obtained after the solder reflow process in step S4 even on the stage where the semiconductor device 1 is completed by performing a lead process in step S10. Also, in the semiconductor device 1 manufactured, the hardness of the metal plate 6 is lower than that of each of the chip mounting portion 2 and the lead portions 4 and 5, and preferably equal to or less than 80% of the hardness of each of the chip mounting portion 2 and the lead portions 4 and 5. The chip mounting portion 2, the lead portion 4, and the lead portion 5 are formed of the same lead frame 41. Thus, the chip mounting portion 2, the lead portion 4, and the lead portion 5 have substantially the same hardness to each other in the semiconductor device 1 manufactured.

Although FIG. 29 is the graph showing the initial hardness $H_1$ of the metal plate 6 and the initial hardness $H_2$ of the lead frame 41 substantially as the same value, the initial hardness $H_1$ of the metal plate 6 may be different from the initial hardness $H_2$ of the lead frame 41. Whether the initial hardness $H_1$ of the metal plate 6 and the initial hardness $H_2$ of the lead frame 41 are the same or different, it is important to set the hardness $H_3$ of the metal plate after the solder reflow process in step S4 lower than the hardness $H_5$ of the lead frame 41 after the solder reflow process in step S4 (that is, $H_3 < H_5$, more preferably, $H_3 \leq 0.8 H_5$ as described above).

The softening temperature $T_1$ of the metal plate 6 to be used in the mounting process in step S3 needs to be lower than the heat treatment $T_3$ of the solder reflow in step S4. Further, the softening temperature $T_1$ is preferably lower than the heat treatment $T_3$ in the solder reflow process at step S4 by 50° C. or more (that is, $T_1 \leq T_3 - 50°$ C.), and more preferably by 100° C. or more (that is, $T_1 \leq T_3 - 100°$ C.). Thus, the solder reflow process in step S4 can sufficiently reduce the hardness of the metal plate 6 (that is, can increase the rate $\alpha 1$ of decrease in hardness), which can more securely prevent the peeling of the solder bonded portion of the metal plate 6.

As described above, the softening temperature $T_1$ is the temperature of the heat treatment where the hardness of the metal plate 6 is decreased to 80% of the initial hardness $H_1$ (that is, $0.8 H_1$). In this embodiment, the metal plate 6 is controlled in the solder reflow process at step S4 to be at a temperature higher than the softening temperature $T_1$, preferably, at a temperature higher than the softening temperature $T_1$ by 50° C. or more, and more preferably at a temperature higher than the softening temperature $T_1$ by 100° C. or more. In the solder reflow process at step S4, the metal plate 6 is heated at such a temperature, for example, for about one minute, so that the metal plate 6 can be sufficiently softened. Thus, the hardness $H_3$ of the metal plate 6 after the solder reflow process in step S4 can be less than 80% of the hardness (corresponding to the initial hardness $H_1$) of the metal plate 6 obtained before the solder reflow process in step S4 (that is, $H_3 < 0.8 H_1$). That is, as described above, the rate $\alpha_1$ of decrease in hardness of the metal plate 6 in the solder reflow process at step S4 can be more than 20% (that is, $\alpha_1 > 20\%$).

The softening temperature $T_1$ of the metal plate 6 to be used in the mounting process of the metal plate 6 at step S3 is preferably equal to or more than 150° C. Thus, the metal plate 6 can be surely prevented from being softened until the metal plate 6 is mounted over the semiconductor chip 3 and the inner lead portion 4a in step S3, which makes the metal plate 6 easy to handle.

The softening temperature of the copper alloy can be adjusted by the kind or amount (content) of additive which is added to the copper. The lead frame 41 needs to have the softening temperature $T_2$ increased as mentioned above, and thus is preferably made of a copper (Cu) alloy, and not pure copper (Cu). The softening temperature $T_2$ of the lead frame is more preferably equal to or more than 400° C. (that is, $T_2 \geq 400°$ C.), for example, about 450° C., so as to prevent the softening of the lead frame 41 as much as possible during the assembly process of the semiconductor device 1. In order to obtain such a softening temperature $T_2$, for example, a copper (Cu) alloy containing Cu (copper) with about 0.007% by weight of Fe (iron) and about 0.03% by weight of P (phosphorus) added thereto can be used as material for the lead frame 41. Suitable material for the lead frame 41 can be, for example, a Cu alloy manufactured by Mitsubishi Shindoh Co., Ltd. under trade name (model number) of TAMAC4 (having a softening temperature of 450° C.).

As the amount (content) of impurities in copper (Cu) material becomes smaller, the softening temperature of the copper tends to be decreased. The metal plate 6 needs to have the softening temperature $T_1$ decreased as mentioned above. The metal plate 6 is made of not a copper (Cu) alloy, but preferably of pure copper (Cu) in use, especially, oxygen-free copper (OFC) in use. The term "oxygen-free copper" as used herein means high-purity copper (Cu) not containing an oxide. The purity of copper (Cu) in the oxygen-free copper is equal to or more than 99.96% (% by weight), and the oxygen ($O_2$) content of the oxygen-free copper is equal to or less than 10 ppm. The use of oxygen-free copper for the metal plate 6 can set the softening temperature $T_1$ of the metal plate 6 to 250° C. or less ($T_1 \leq 250°$ C.), for example, about 200° C. Suitable material for the lead frame 41 can be, for example, a Cu alloy manufactured by Mitsubishi Shindoh Co., Ltd. under trade name (model number) of OFC (having a softening temperature of 200° C.).

The inventors have carried out a high-temperature and high-humidity load test on semiconductor devices (corresponding to the semiconductor device 1) manufactured in the following cases. Unlike this embodiment, one semiconductor device subjected to the test was manufactured as a comparative example in such a manner that a copper alloy having the same high softening temperature as that of the lead frame 41 was used for the metal plate 6 so as not to soften the metal plate 6 during the assembly process of the semiconductor device 1. Like this embodiment, the other semiconductor device subjected to the test was manufactured in such a manner that the oxygen-free copper having the low softening temperature was used for the metal plate 6 so as to soften the metal plate 6 in the solder reflow process at step S4. After the high-temperature and high-humidity load test, the sealing resin portion 8 was removed from each semiconductor device, and then each solder bonded portion of the metal plate 6 was observed. As a result, in the comparative example where the same high-softening temperature copper alloy as that of the lead frame 41 was also used in the metal plate 6 not to soften the metal plate 6 during the assembly process of the semiconductor device 1, some of one hundred semiconductors subjected to the load test were observed to have the solder bonded portions of the metal plate 6 peeled off. In contrast, like this embodiment, in the case where the oxygen-free copper having the low softening temperature was used in the metal plate 6 to soften the metal plate 6 in the solder reflow process at step S4, no peeling of the solder bonded portion of the metal plate 6 was observed among all one hundred semiconductor devices subjected to the load test. As mentioned above, this embodiment can prevent peeling of the solder bonded portion of the metal plate 6, and can improve the reliability of the semiconductor device 1.

Although the invention made by the inventors has been specifically described based on the embodiments, the invention is not limited to those embodiments disclosed herein. It will be apparent to those skilled in the art that various modifications can be made to the embodiments without departing from the scope of the invention.

The invention is effectively applied to semiconductor devices and manufacturing techniques thereof.

What is claimed is:

1. A semiconductor device comprising:
a chip mounting portion;
a semiconductor chip including a first main surface, a first electrode formed in the main surface, and a second main surface opposite to the first main surface, the semiconductor chip being mounted over the chip mounting portion such that the second main surface is opposed to the chip mounting portion;
a first lead portion arranged spaced apart from the chip mounting portion;
a metal plate for electrically cooping the first lead portion to the first electrode of the semiconductor chip; and
a sealing member for covering a part of the chip mounting portion, a part of the first lead portion, the semiconductor chip, and the metal plate,
wherein a hardness of the metal plate is lower than that of each of the chip mounting portion and the first lead portion,
wherein the metal plate is respectively solder-bonded to the first electrode of the semiconductor chip and the first lead portion, and
wherein the metal plate is comprised of oxygen-free copper, and the chip mounting portion and the first lead portion are comprised of a copper alloy.

2. The semiconductor device according to claim 1, wherein a softening temperature of each of the chip mounting portion and the first lead portion is higher than a melting point of a first solder for coupling the metal plate to the first electrode of the semiconductor chip, and a melting point of a second solder for coupling the metal plate to the first lead portion.

3. The semiconductor device according to claim 2, wherein the semiconductor chip is solder-bonded to the chip mounting portion, and
wherein the softening temperature of each of the chip mounting portion and the first lead portion is higher than a melting point of a third solder for coupling the semiconductor chip to the chip mounting portion.

4. The semiconductor device according to claim 3, wherein the softening temperature of each of the chip mounting portion and the first lead portion is higher than the melting point of the first solder, the melting point of the second solder, and the melting point of the third solder, by 50° C. or more.

5. The semiconductor device according to claim 4, wherein the second main surface of the semiconductor chip has a back surface electrode of the semiconductor chip formed therein, and
wherein the back surface electrode of the semiconductor chip is electrically coupled to the chip mounting portion via the third solder.

6. The semiconductor device according to claim 5, further comprising:
a second electrode formed in the first main surface of the semiconductor chip;
a second lead portion arranged spaced apart from the chip mounting portion and the first lead portion; and
a conductive wire for electrically coupling the second lead portion to the second electrode of the semiconductor chip,
wherein the sealing member also covers a part of the second lead portion and the conductive wire.

7. The semiconductor device according to claim 6, wherein the semiconductor chip has a MISFET formed therein,
wherein the first electrode is an electrode pad for a source of the MISFET,
wherein the second electrode is an electrode pad for a gate electrode of the MISFET, and
wherein the back surface electrode is a back surface electrode for a drain of the MISFET.

8. A manufacturing method of a semiconductor device, comprising the steps of:
(a) preparing a lead frame including a chip mounting portion and a first lead portion;
(b) after the step (a), mounting a semiconductor chip having a first main surface, a first electrode formed in the first main surface, and a second main surface opposite to the first main surface, over the chip mounting portion of the lead frame via a bonding material such that the second main surface is opposed to the chip mounting portion;
(c) after the step (b), arranging a metal plate over the first electrode of the semiconductor chip via a first solder, and over the first lead portion via a second solder;
(d) after the step (c), bonding the metal plate to the first electrode of the semiconductor chip via the first solder, and to the first lead portion via the second solder, by a heat treatment for melting the first solder and the second solder; and (e) after the step (d), forming a sealing member for covering a part of the chip mounting portion, a part of the first lead portion, the semiconductor chip, and the metal plate, wherein a softening temperature of the metal plate used in the step (c) is lower than a softening temperature of the lead frame prepared in the step (a).

9. The manufacturing method of a semiconductor device according to claim 8, wherein the softening temperature of the lead frame prepared in the step (a) is higher than a temperature of the heat treatment in the step (d), and wherein the softening temperature of the metal plate used in the step (c) is lower than the temperature of the heat treatment in the step (d).

10. The manufacturing method of a semiconductor device according to claim 9, wherein a hardness of the metal plate after the heat treatment in the step (d) is lower than a hardness of the lead frame after the heat treatment in the step (d).

11. The manufacturing method of a semiconductor device according to claim 10, wherein the metal plate is comprised of oxygen-free copper, and the lead frame is comprised of a copper alloy.

12. The manufacturing method of a semiconductor device according to claim 11, further comprising the step of (f) after the step (e), cutting the lead frame outside the sealing member, wherein the lead frame is not at a temperature equal to or more than the softening temperature of the lead frame until the lead frame is cut in the step (f) after the step (a).

13. The manufacturing method of a semiconductor device according to claim 12, wherein the softening temperature of the metal plate used in the step (c) is lower than the heat treatment temperature of the heat treatment in the step (d) by 50° C. or more.

14. The manufacturing method of a semiconductor device according to claim 13, wherein the softening temperature of the lead frame prepared in the step (a) is higher than the heat treatment temperature of the heat treatment in the step (d) by 50° C. or more.

15. The manufacturing method of a semiconductor device according to claim 14, wherein the softening temperature of the metal plate used in the step (c) is equal to or more than 150° C.

16. The manufacturing method of a semiconductor device according to claim 15, wherein the bonding material is comprised of a third solder, and wherein the heat treatment in the step (d) melts the third solder.

17. The manufacturing method of a semiconductor device according to claim 16, wherein the second main surface of the semiconductor chip has a back surface electrode of the semiconductor chip formed therein, and wherein the back surface electrode of the semiconductor chip is bonded to the chip mounting portion via the third solder in step (d).

18. The manufacturing method of a semiconductor device according to claim 17, wherein the lead frame further includes a second lead portion, and the semiconductor chip further includes a second electrode formed in the first main surface, the method further comprising the step of:

after the step (d) and before the step (e), electrically coupling the second lead portion to the second electrode of the semiconductor chip via a conductive wire, wherein in the step (e), the sealing member is formed so as to cover a part of the chip mounting portion, a part of the first lead portion, a part of the second lead portion, the semiconductor chip, the metal plate, and the conductive wire.

19. The manufacturing method of a semiconductor device according to claim 18, wherein the semiconductor chip has a MISFET formed therein, wherein the first electrode is an electrode pad for a source of the MISFET, wherein the second electrode is an electrode pad for a gate electrode of the MISFET, and wherein the back surface electrode is a back surface electrode for a drain of the MISFET.

20. A manufacturing method of a semiconductor device, comprising the steps of:

(a) preparing a lead frame including a chip mounting portion and a first lead portion;

(b) after the step (a), mounting a semiconductor chip having a first main surface, a first electrode formed in the first main surface, and a second main surface opposite to the first main surface, over the chip mounting portion of the lead frame via a bonding material such that the second main surface is opposed to the chip mounting portion;

(c) after the step (b), arranging a metal plate over the first electrode of the semiconductor chip via a first solder, and over the first lead portion via a second solder;

(d) after the step (c), bonding the metal plate to the first electrode of the semiconductor chip via the first solder, and to the first lead portion via the second solder, by a heat treatment for melting the first solder and the second solder; and (e) after the step (d), forming a sealing member for covering a part of the chip mounting portion, a part of the first lead portion, the semiconductor chip, and the metal plate, wherein a rate of decrease in hardness of the metal plate by the heat treatment in the step (d) is larger than a rate of decrease in hardness of the lead frame by the heat treatment in the step (d).

21. The manufacturing method of a semiconductor device according to claim 20, wherein a hardness of the metal plate after the heat treatment in the step (d) is lower than that of the lead frame after the heat treatment in the step (d).

22. The manufacturing method of a semiconductor device according to claim 21, wherein the metal plate is comprised of oxygen-free copper, and the lead frame is comprised of a copper alloy.

23. The manufacturing method of a semiconductor device according to claim 22, wherein by the heat treatment in the step (d), the hardness of the metal plate becomes less than 80% of the hardness obtained before the heat treatment.

* * * * *